United States Patent
Watanabe et al.

(10) Patent No.: US 9,308,568 B2
(45) Date of Patent: Apr. 12, 2016

(54) METHOD FOR MANUFACTURING A CAULKED ASSEMBLY

(71) Applicant: APS Japan Co., Ltd., Osaka-shi, Osaka (JP)

(72) Inventors: Hidemitsu Watanabe, Osaka (JP); Hisanori Kawasaki, Osaka (JP); Hiroyuki Watanabe, Osaka (JP)

(73) Assignee: APS JAPAN CO., LTD., Osaka-shi (JP)

( * ) Notice: Subject to any disclaimer, the term of this patent is extended or adjusted under 35 U.S.C. 154(b) by 410 days.

(21) Appl. No.: 13/750,275

(22) Filed: Jan. 25, 2013

(65) Prior Publication Data

US 2013/0192048 A1 Aug. 1, 2013

(30) Foreign Application Priority Data

Jan. 26, 2012 (JP) .................................. 2012-013752

(51) Int. Cl.
| | |
|---|---|
| *B21D 39/03* | (2006.01) |
| *B21K 25/00* | (2006.01) |
| *B23P 11/00* | (2006.01) |
| *B21D 19/08* | (2006.01) |

(52) U.S. Cl.
CPC .............. *B21D 39/03* (2013.01); *B21D 19/088* (2013.01); *B21K 25/00* (2013.01); *B23P 11/005* (2013.01); *H01L 2924/0002* (2013.01); *Y10T 29/49908* (2015.01); *Y10T 29/49915* (2015.01)

(58) Field of Classification Search
CPC .... B21D 19/088; B21D 39/026; B21K 25/00; F16B 17/006; Y10T 29/49908; Y10T 29/49915
See application file for complete search history.

(56) References Cited

FOREIGN PATENT DOCUMENTS

| | | | |
|---|---|---|---|
| DE | 10118973 A1 | * | 10/2002 |
| JP | 2003-178602 | | 6/2003 |
| JP | 2010-086713 | | 4/2010 |

* cited by examiner

*Primary Examiner* — Jermie Cozart
(74) *Attorney, Agent, or Firm* — Kratz, Quintos & Hanson, LLP

(57) ABSTRACT

Provided is a method for manufacturing a caulked assembly that is capable of manufacturing the caulked assembly at a low cost, preventing reduction of the strength of a columnar body caused by a circumferential groove, preventing deformation of the columnar body, and assembling a slimmer columnar body with a plate-like body. A mounting hole 10 for inserting and assembling a columnar body 2 is provided in a metallic plate-like body 1, and a thick portion 11 is formed along an inner circumferential edge of the mounting hole 10. Thereafter, as shown in FIG. 1(*a*), the columnar body 2 is inserted into the mounting hole 10 of the plate-like body 1 so that the plate-like body 1 is set in an assembly position on an outer circumferential surface of the columnar body 2. Further, the thick portion 11 is compressively pressed from an axial direction of the columnar body so as to be plastically deformed toward the center of the mounting hole 10 to thereby tighten and fix the thick portion 11 to the outer circumferential surface of the columnar body 2.

2 Claims, 41 Drawing Sheets

Fig. 3
(a)
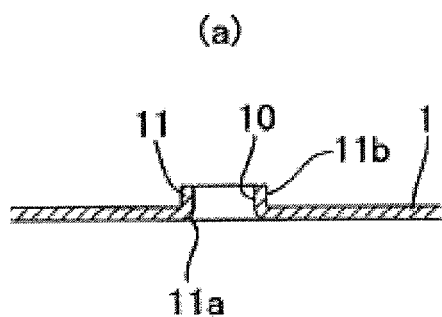
(b)
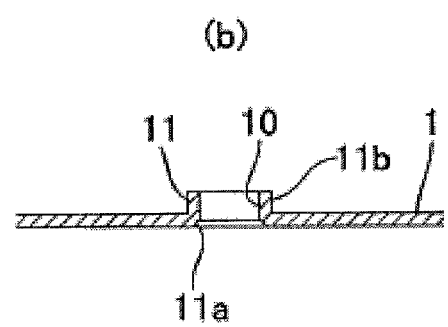
(c)
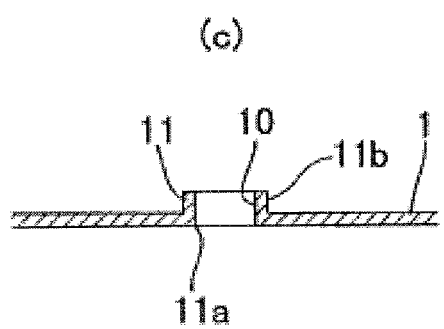

Fig. 5
(a)
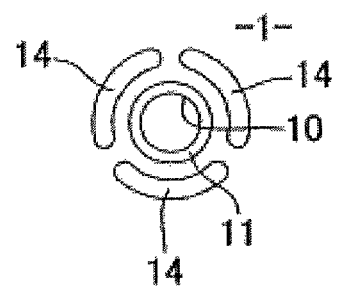
(b)
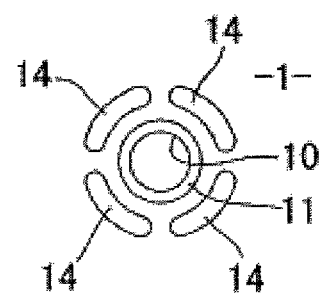
(c)
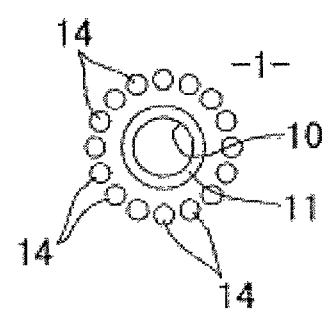

Fig. 11
(a)
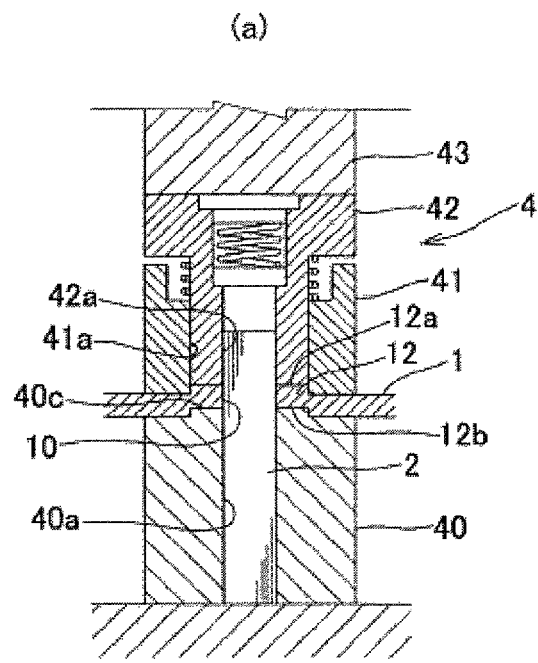
(b)
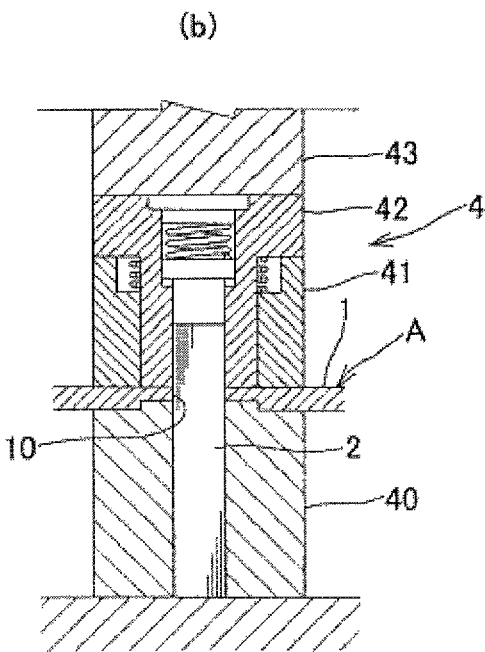

Fig. 12
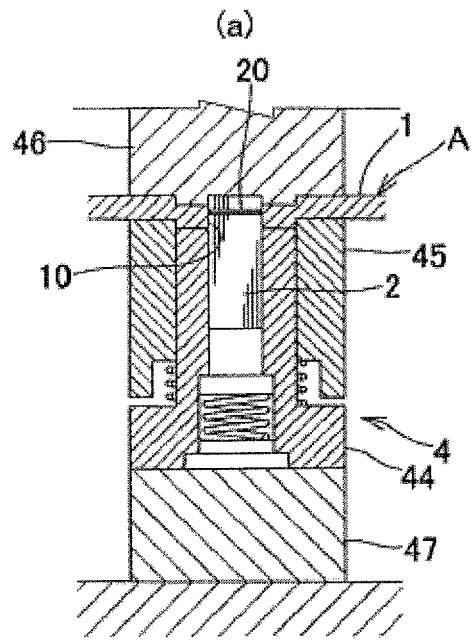
(a)
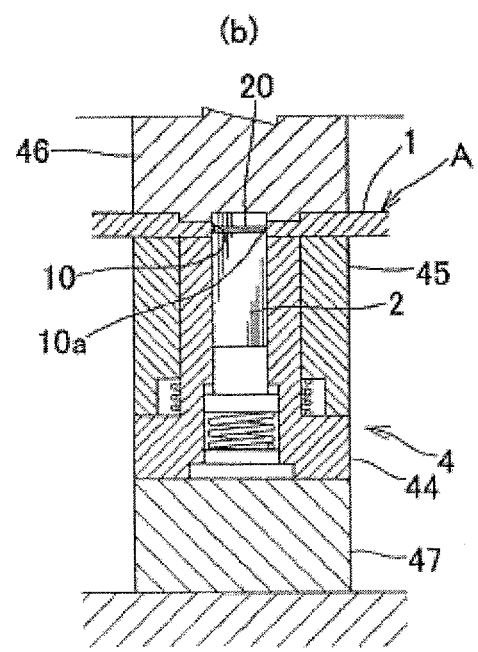
(b)

Fig. 13
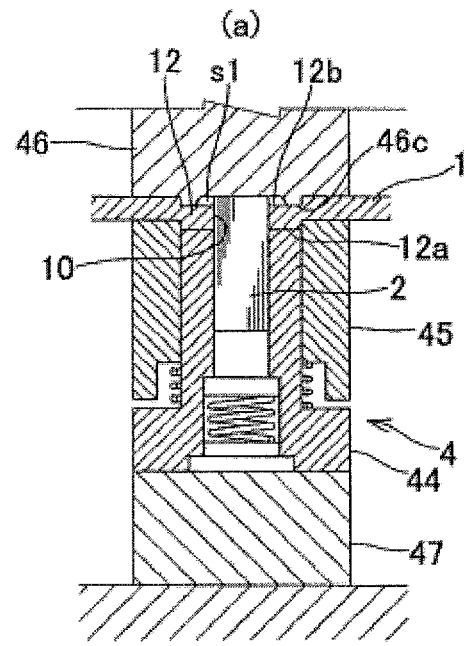
(a)
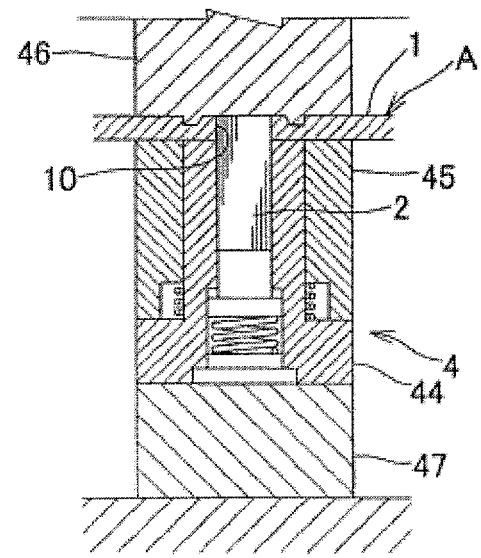
(b)

Fig. 14
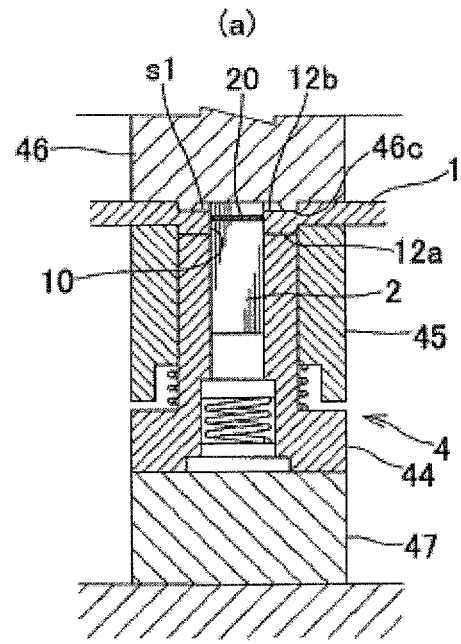
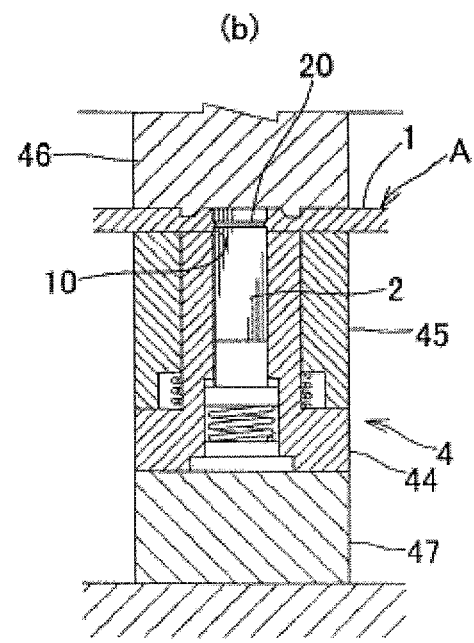

Fig. 15
(a)
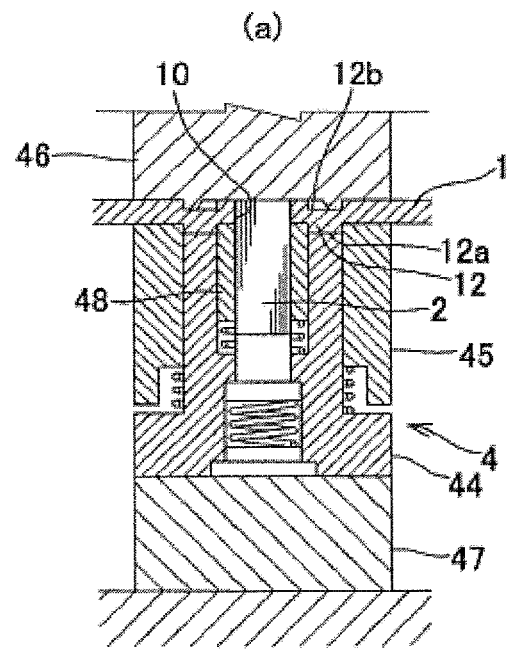
(b)
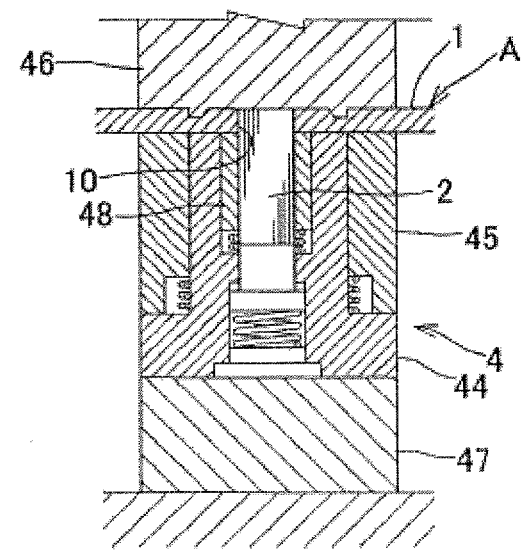

Fig. 16
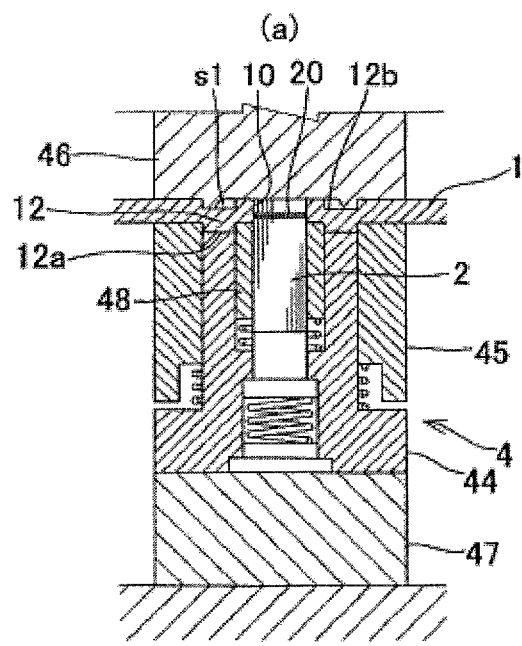
(a)
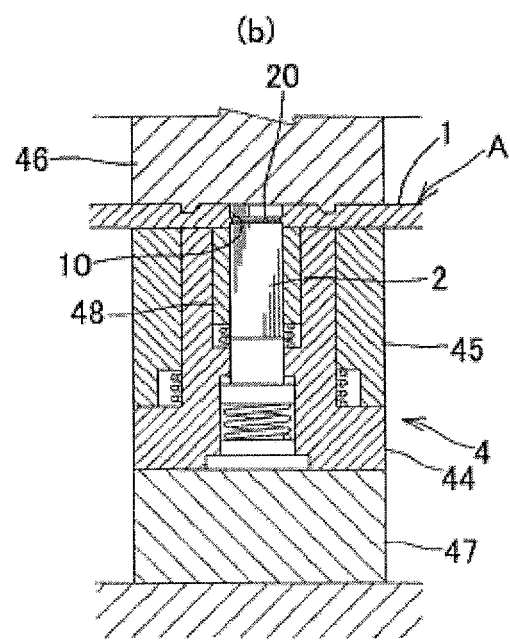
(b)

Fig. 17
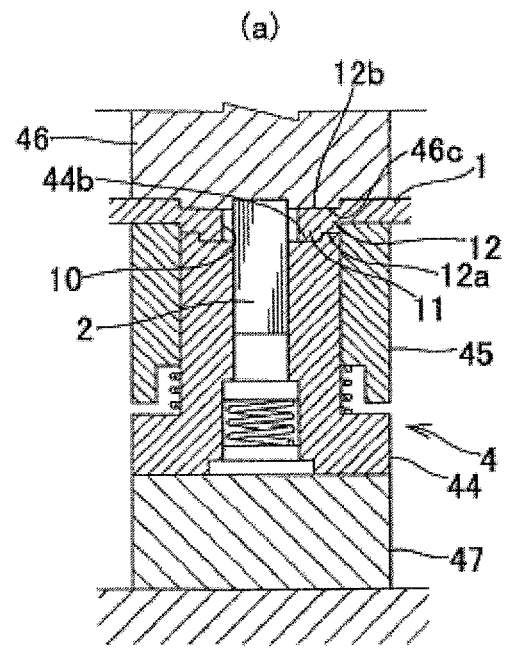
(a)
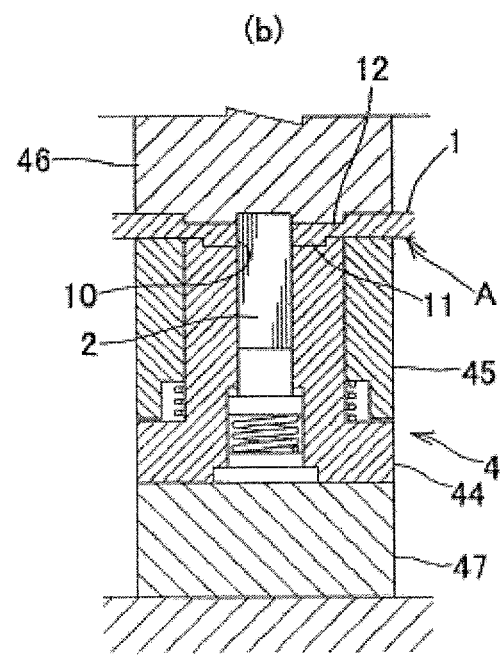
(b)

Fig. 18
(a)
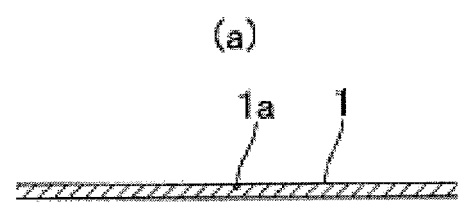
(b)
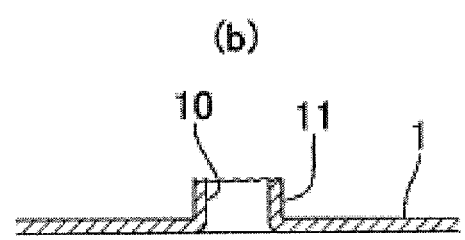

Fig. 21
(a)  (b)
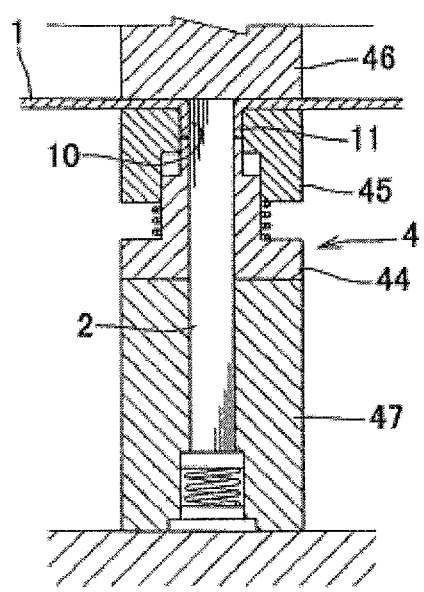 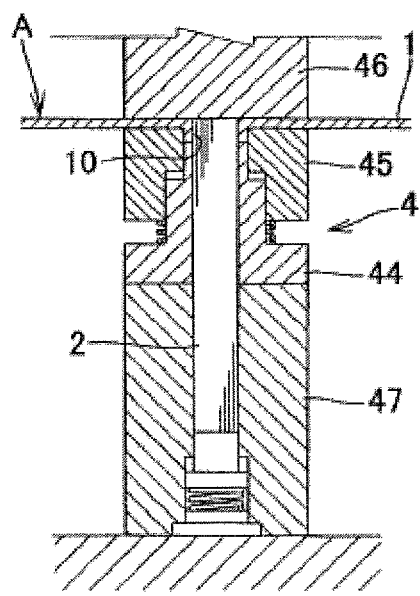

Fig. 33]

Fig. 35
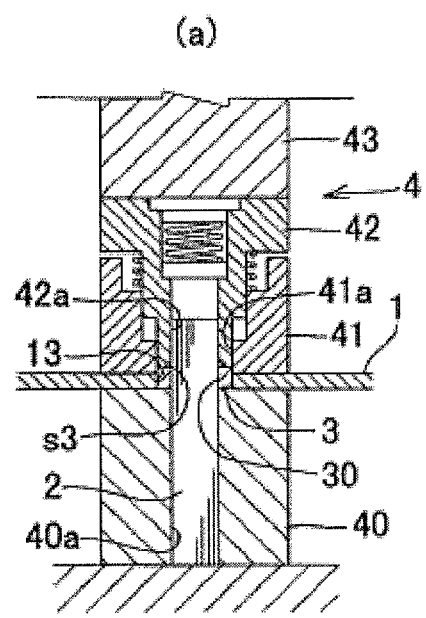
(a)
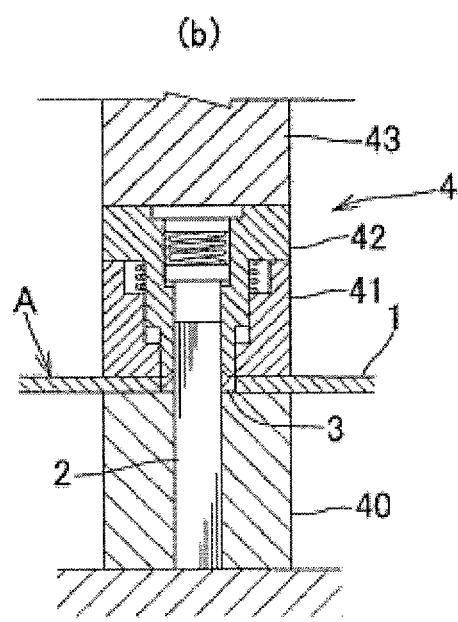
(b)

METHOD FOR MANUFACTURING A CAULKED ASSEMBLY

TECHNICAL FIELD

The present invention relates to a high-strength processing technique that is capable of firmly fixing a hollow or solid columnar body to a plate-like body.

BACKGROUND ART

Conventionally, a processing technique of this kind has been performed in the following manner as in Patent Document 1. A flange portion is formed on a midway part of a shaft body as shaft caulking, and a circular hole is punched on a plate-like body which is a press component as a subject of assembly. A tip of the shaft body which is inserted through the circular hole is crushed by a caulking machine for exclusive use so that the press component is sandwiched between the crushed head part of the shaft body and the flange portion to thereby assemble the shaft body with the plate-like body. Alternatively, a more complicated special shape is previously formed on the shaft body, and the shaft body is press-fitted into the circular hole formed in the press component to thereby join the shaft body to the press component.

However, a large flange portion needs to be provided on the midway part of the shaft body in order to sandwich the press component between the crushed head part of the shaft body and the flange portion. Accordingly, it is necessary to cut a shaft material that is approximately 50% thicker than a shaft diameter required for using as a product to produce a flange shape, which increases material and processing costs. Further, a high manufacturing cost is required also for forming the special shape, which limits the cost reduction.

In view of the above, there has also been proposed a caulking method in which a mounting hole for inserting and assembling a columnar body is provided in a metallic plate-like body, a thick portion is formed along an inner circumferential edge of the mounting hole by burring, a circumferential groove having a predetermined depth is formed at an assembly position on an outer circumferential surface of the columnar body to be inserted into the mounting hole, the columnar body is inserted into the mounting hole of the metallic plate-like body so as to be set in an assembly position where the thick portion and the circumferential groove face each other, and the thick portion is compressively pressed from an axial direction of the columnar body so as to be plastically deformed toward the center of the mounting hole to thereby cause the thick portion to bite into the facing circumferential groove of the columnar body (see Patent Document 2 and Patent Document 3).

In this method, it is not necessary to provide a flange portion on the midway part of the columnar body or produce a complicated special shape. Therefore, this method makes it possible to assemble the plate-like body with the columnar body by calking by easy press working as well as at a low cost only by providing the circumferential groove which can be easily formed in the columnar body and providing the thick portion on the periphery of the mounting hole of the plate-like body by burring. Further, since the thick portion is formed on the plate-like body, and then plastically deformed so as to bite into the circumferential groove, it is possible to obtain sufficient caulking strength as well as the strength of the plate-like body itself. Therefore, it is possible to achieve an effect that, even if the plate-like body is thinner than a conventional plate-like body, the same high caulking strength as that of the conventional one can be obtained.

CITATION LIST

Patent Literatures

Patent Document 1: JP-A No. 2003-260529
Patent Document 2: JP-A No. 2007-283404
Patent Document 3: JP-A No. 2008-221261
Patent Document 4: JP-A No. 2005-74482

SUMMARY OF INVENTION

Technical Problem

In the meantime, when the thick portion formed by burring and the like is crushed to caulk the plate-like body with the columnar body, a rough standard of the smallest size of a remaining convex portion of the thick portion of the plate-like body after the caulking is zero (shaft holding size plate thickness). However, if there is no straight remaining part across the circumferential groove other than the part biting into the circumferential groove, the accuracy in the perpendicularity and the like of the caulked columnar body cannot be ensured. Therefore, a limit of the plate thickness of the plate-like body depends on the width of the circumferential groove of the columnar body. For this reason, such a method is unsuitable for caulking of a thin plate.

In addition, since it is necessary to form the circumferential groove on the columnar body, a cost for the processing thereof is required. Further, stress concentration occurs in the circumferential groove, which may cause bend of such a part depending on handling thereof. Accordingly, the shaft diameter of the columnar body is limited, and the method is therefore unsuitable for caulking of a slim shaft. Further, when a circumferential groove is formed on the columnar body in this manner, directivity may be generated in the shaft, which may lead to an operational error. In order to solve such a problem, another circumferential groove can be added in a position that is symmetrical to the position where the circumferential groove is previously formed to thereby cancel the directivity. However, in this case, an additional cost is required. Further, even in the case of a relatively thick columnar body, when the columnar body is made partially or totally hollow, for example, by forming a screw hole in the axial direction thereof, and a circumferential groove is formed within the hollow area or in the vicinity thereof, there is a problem in that the wall thickness of the columnar body in such an area is made thin and an enough strength cannot, therefore, be obtained. Especially in the case of a columnar body that is made of a low-strength material such as resin and aluminum, strength poverty caused by forming a circumferential groove within a hollow area or in the vicinity thereof becomes pronounced. Such a problem arises also when forming a circumferential groove in a columnar body that is hollow from the beginning. Further, even in the case of a columnar body that is not hollow, when the columnar body is made of a low-strength material such as resin and aluminum, and a plate-like body is made of, for example, a material that is hard relative to the material of the columnar body such as iron materials and stainless steel materials, even if caulking is tried to be performed by forming a circumferential groove, the plate-like body cannot bite into the circumferential groove properly. As a result, caulking strength that should be obtained by the plate-like body biting into the circumferential groove cannot be obtained. Instead, stress is generated in the circumferential groove due to the plate-like body biting thereinto, or stress concentration is generated in the circumferential groove due to drop impact or the like of a product, which may cause a problem such as deformation and breakage of the product.

Further, although the burring of the thick portion is performed after a prepared hole is punched on the plate-like body, it is not possible to perform caulking on a shaft having a smaller diameter than the diameter of the prepared hole in a caulking method in which the thus formed thick portion is crushed. That is, when burring is performed on a plate member, blanking is first performed to form a so-called prepared hole, and a processing for forming a convex is then performed. A diameter for holding a caulked shaft, namely, the diameter of the mounting hole after crushing a thick portion which is composed of the convex formed by burring so that the thickness of the thick portion becomes the same as the thickness of the plate member, namely, a remaining convex becomes zero, never becomes smaller than the diameter of the prepared hole before the burring. That is, a shaft having a smaller diameter than the diameter of the prepared hole cannot be caulked. Further, it is generally recognized that a limit of the diameter of a prepared hole which is formed in a metallic thin plate having a thickness of equal to or less than 1 mm is approximately 0.6 mm on a mass-produced level. If the diameter of a prepared hole is made smaller than this value, a trouble such as punch break off may occur, thereby lowering the productivity. Therefore, it is not possible to assemble a shaft having a diameter equal to or smaller than 0.6 mm with such a thin plate by caulking.

As another method, there has been also proposed a method in which a washer member is provided on a lower surface of a plate-like body, the washer member is caulked so as to fill a circumferential groove formed in a pin, and the pin is held by sandwiching the plate-like body between a flange of the pin and the washer member (see Patent Document 4). However, in this method, a flange is required, a caulked assembly obtained after the caulking is made thick due to the thickness of the flange and a remaining part of the washer caused by insufficient caulking, and there is a problem also in the accuracy thereof.

Further, it is common to perform nitriding on a thin plate-like body in order to increase the strength thereof. However, the above-described caulking by burring is rigid and has low ductility, and cannot therefore be plastically deformed. Therefore, the nitriding cannot be performed due to generation of cracking and the like. Therefore, in the case of a grinding shaft that is particularly slim and has been hardened, there has been performed a method in which a columnar body 2 is previously press-fitted into a bush 103, and the bush 103 is then caulked with a plate-like body 1 as shown in FIGS. 44(a) and 44(b). However, this method needs to perform both of a press-fitting step of the bush 103 and a caulking step, thereby limiting improvement of the manufacturing efficiency as well as increasing cost. Further, since the caulking is performed with the bush 103 into which the columnar body 2 being press-fitted, when mechanical shock and stress caused by the caulking are applied to the bush 103, a problem such as reduction of press-fitting maintaining force is caused. Further, since the accuracy in perpendicularity and the like depends on the accuracy of components, the accuracy of perpendicularity and the like is also deteriorated due to the influence of variation of the components and the like.

Solution to Problem

In order to solve the above problems, the present invention provides a method for manufacturing a caulked assembly of a metallic plate-like body with a hollow or solid columnar body, the method comprising the steps of providing, in the metallic plate-like body, a mounting hole for inserting and assembling the columnar body and forming a thick portion along an inner circumferential edge of the mounting hole; inserting the columnar body into the mounting hole of the metallic plate-like body to set the metallic plate-like body in an assembly position on an outer circumferential surface of the columnar body; and caulking for compressively pressing the thick portion from an axial direction of the columnar body to plastically deform the thick portion toward a center of the mounting hole to tighten and fix the thick portion to the outer circumferential surface of the columnar body.

It is preferred that the columnar body be formed into a straight shape which does not have a flange portion to be locked with an upper surface or a lower surface of a circumferential edge of the mounting hole of the metallic plate-like body in an end part and a midway part in an axial direction of the columnar body.

Further, the present invention also provides a method for manufacturing a caulked assembly of a metallic plate-like body with a hollow or solid columnar body, the method comprising the steps of providing, in the metallic plate-like body, a mounting hole for inserting and assembling the columnar body and forming a step portion around the mounting hole along a whole circumference or a part of the circumference of the mounting hole; inserting the columnar body into the mounting hole of the metallic plate-like body to set the metallic plate-like body in an assembly position on an outer circumferential surface of the columnar body; and caulking for compressively pressing the step portion from an axial direction of the columnar body to plastically deform the step portion toward a center of the mounting hole to tighten and fix an inner circumferential part of the mounting hole to the outer circumferential surface of the columnar body.

It is preferred that a depressed surface of the step portion at one side thereof be made to serve as a receiving portion, and the step portion be deformed by applying pressure to a protruding surface of the step portion at the other side thereof.

In addition, it is preferred that the step portion be compressively pressed while positioning and holding the columnar body located at an inner side of the step portion by a press tool which supports the receiving portion of the step portion.

Further, it is preferred that the step portion be formed by half blanking of press working.

Further, it is also preferred that the step portion be formed in a region separated from an inner circumferential edge of the mounting hole.

Further, it is also preferred that a thick portion be formed along the inner circumferential edge of the mounting hole, and the step portion and the thick portion be compressively pressed.

In addition, it is also preferred that the method further comprise a step of forming a concave portion having a predetermined depth in the assembly position on the outer circumferential surface of the columnar body to be inserted into the mounting hole, and the caulking step be performed by compressively pressing the step portion from the axial direction to plastically deform the step portion toward the center of the mounting hole to tighten and fix the inner circumferential part of the mounting hole to the outer circumferential surface of the columnar body and cause the inner circumferential part of the mounting hole to bite into the concave portion.

Further, the present invention also provides a method for manufacturing a caulked assembly of a metallic plate-like body with a hollow or solid columnar body, the method comprising the steps of providing, in the metallic plate-like body, a mounting hole for inserting and assembling the columnar body by performing burring on the metallic plate-like body without a prepared hole and forming a cylindrical thick portion by the burring along an inner circumferential edge of the mounting hole; inserting the columnar body into the mounting hole of the metallic plate-like body to set the metallic plate-like body in an assembly position on an outer circumferential surface of the columnar body; and caulking for compressively pressing the thick portion from an axial direction of the columnar body to plastically deform the thick portion toward a center of the mounting hole to tighten and fix the thick portion to the outer circumferential surface of the columnar body.

It is preferred that the thick portion formed by the burring be formed into a circular truncated cone shape which is tapered toward a tip thereof, and the tip having a small diameter of the thick portion formed along the mounting hole be made capable of inserting the columnar body therethrough.

Further, it is also preferred that the method further comprise a step of forming a concave portion having a predetermined depth in the assembly position on the outer circumferential surface of the columnar body to be inserted into the mounting hole, and the caulking step be performed by compressively pressing the thick portion from the axial direction to plastically deform the thick portion toward the center of the mounting hole to tighten and fix the thick portion to the outer circumferential surface of the columnar body and cause the thick portion to bite into the concave portion.

Further, the present invention also provides a method for manufacturing a caulked assembly of a plate-like body with a hollow or solid columnar body, the method comprising the steps of providing, in the plate-like body, a fitting hole for fitting a holding member having a mounting hole for inserting the columnar body; fitting the holding member into the fitting hole; inserting the columnar body into the mounting hole of the holding member to set the plate-like body and the holding member in an assembly position on an outer circumferential surface of the columnar body; and caulking for compressively pressing the holding member from an axial direction of the columnar body to plastically deform the holding member both inwardly and outwardly, namely, toward a center of the mounting hole and also toward an inner circumferential surface of the fitting hole of the plate-like body to tighten and fix the holding member to the outer circumferential surface of the columnar body and cause the holding member to spread within an inner circumferential part of the fitting hole of the plate-like body so as to be fixed thereto.

It is preferred that the holding member be fixed to the inner circumferential part of the fitting hole of the plate-like body by fixing the holding member to the inner circumferential surface of the fitting hole by spread of the holding member, and also by plastically deforming the holding member so as to cover a part of a surface of the plate-like body around the fitting hole to fix the holding member to the surface.

Further, it is also preferred that a depression be formed on the inner circumferential surface of the fitting hole, and the holding member be fixed to the inner circumferential part of the fitting hole of the plate-like body by fixing the holding member to the inner circumferential surface of the fitting hole by spread of the holding member, and also by causing the holding member to bite into the depression.

Further, it is also preferred that the method further comprise a step of forming a concave portion having a predetermined depth in the assembly position on the outer circumferential surface of the columnar body to be inserted into the mounting hole of the holding member, and the caulking step be performed by compressively pressing the holding member from the axial direction to plastically deform the holding member both inwardly and outwardly, namely, toward the center of the mounting hole and also toward the inner circumferential surface of the fitting hole of the plate-like body to tighten and fix the holding member to the outer circumferential surface of the columnar body as well as cause the holding member to bite into the concave portion, and cause the holding member to spread within the inner circumferential part of the fitting hole of the plate-like body so as to be fixed thereto.

Advantageous Effects of Invention

The method for manufacturing the caulked assembly according to an aspect of the present invention as described above includes the steps of providing, in the metallic plate-like body, a mounting hole for inserting and assembling the columnar body and forming a thick portion along an inner circumferential edge of the mounting hole; inserting the columnar body into the mounting hole of the metallic plate-like body to set the metallic plate-like body in an assembly position on an outer circumferential surface of the columnar body; and caulking for compressively pressing the thick portion from an axial direction of the columnar body to plastically deform the thick portion toward a center of the mounting hole to tighten and fix the thick portion to the outer circumferential surface of the columnar body. Therefore, it is not necessary to provide a conventional circumferential groove. Accordingly, since grooving is not required, it is possible to manufacture the caulked assembly at a low cost, prevent reduction of the strength (concentration of stress) of the columnar body caused by a circumferential groove, prevent deformation of the columnar body, and assemble a slimmer columnar body with the plate-like body.

Generally, press-fitting between metals each having a particularly high hardness such as iron metal and stainless steel metal is difficult. However, it is possible to easily obtain a configuration equivalent thereto by the method of the present invention. Further, since it is not necessary to cause a plate-like body to bite into a circumferential groove, it is possible to firmly fixing even a thin plate-like body whose thick portion would have a small volume to a columnar body with sufficient strength by caulking. Further, if there is no straight remaining part across a circumferential groove other than a part of a columnar body, the part biting into the circumferential groove, it is not possible to ensure the accuracy in the perpendicularity and the like of the caulked columnar body. However, in the method of the present invention, since a circumferential groove is not provided, it is possible to assemble a plate-like body that is made thin to the limit of holding accuracy with a columnar body. In addition, also regarding a columnar body, it is possible to assemble a columnar body that is made slim to the limit of hole processing of a plate-like body with the plate-like body. Furthermore, since a circumferential groove is not required to be provided in a columnar body, it is possible to cancel directivity of a columnar body before assembling. Therefore, a mistake of an assembling direction can be prevented. In addition, control for producing a circumferential groove is not necessary as well as an operation is made easier, thereby making it possible to achieve a high manufacturing efficiency. Furthermore, it is possible to fix a plate-like body even to a columnar body that is partially or totally hollow by caulking not with insufficient strength, but with sufficient strength. Furthermore, even in a case where a columnar body is made of a low-strength material such as resin and aluminum, and a plate-like body is made of a material that is hard relative to the material of the columnar body such as iron materials and stainless steel materials, it is also possible to fix the plate-like body to the columnar body by caulking with sufficient strength. In this case, there is no risk of deformation or breakage of the columnar body due to insufficient strength.

Further, according to another aspect of the present invention, the method includes the steps of providing, in the metallic plate-like body, a mounting hole for inserting and assembling the columnar body and forming a step portion around the mounting hole along a whole circumference or a part of the circumference of the mounting hole; inserting the columnar body into the mounting hole of the metallic plate-like body to set the metallic plate-like body in an assembly position on an outer circumferential surface of the columnar body; and caulking for compressively pressing the step portion from an axial direction of the columnar body to plastically deform the step portion toward a center of the mounting hole to tighten and fix an inner circumferential part of the mounting hole to the outer circumferential surface of the columnar body. Also in this case, formation of a circumferential groove is not necessarily required, and the plate-like body and the columnar body can be firmly fixed to each other by caulking. Further, even in a case where a circumferential groove is omitted, the same effect as above can be achieved. In addition, a columnar body that is slimmer than the mounting hole can be assembled with the plate-like body, and a columnar body having an outer size equal to or smaller than the limit of the diameter of a pressed hole (0.6 mm, for example) can also be fixed to the plate-like body by caulking.

Further, since a depressed surface of the step portion at one side thereof is made to serve as a receiving portion, and the step portion is deformed by applying pressure to a protruding surface of the step portion at the other side thereof, it is possible to position and reliably hold the plate-like body by the receiving portion. Therefore, it is possible to assemble a columnar body that is slimmer than the mounting hole with the plate-like body accurately and reliably. Specifically, by compressively pressing the step portion while positioning and holding the columnar body located at an inner side of the step portion by a press tool which supports the receiving portion of the step portion, such a positioning can be ensured, and even a slim columnar body can therefore be accurately assembled with a plate-like body. Further, the step portion can be efficiently produced by half blanking of press working.

Further, according to yet another aspect of the present invention, the method includes the steps of providing, in the metallic plate-like body, a mounting hole for inserting and assembling the columnar body by performing burring on the metallic plate-like body without a prepared hole and forming a cylindrical thick portion by the burring along an inner circumferential edge of the mounting hole; inserting the columnar body into the mounting hole of the metallic plate-like body to set the metallic plate-like body in an assembly position on an outer circumferential surface of the columnar body; and caulking for compressively pressing the thick portion from an axial direction of the columnar body to plastically deform the thick portion toward a center of the mounting hole to tighten and fix the thick portion to the outer circumferential surface of the columnar body. Since there is no prepared hole, an effective filling volume can be obtained to the maximum extent possible. Accordingly, a columnar body that is made slim to the limit of obtaining a necessary filling volume can be fixed to the plate-like body by caulking. Further, since there is no prepared hole, a tip of a convex portion of the thick portion formed by burring has more irregularities than a case where a prepared hole is previously formed on the plate-like body, and the tip therefore becomes non-uniform and rough. However, such non-uniformity is made uniform by pressure applied thereto by caulking, and does not therefore cause an adverse effect on the fixing by caulking and the appearance of the caulked assembly.

Further, the thick portion formed by the burring is formed into a circular truncated cone shape which is tapered toward a tip thereof, and the tip having a small diameter of the thick portion formed along the mounting hole is made capable of inserting the columnar body therethrough. Therefore, an expansion amount of the tip of the thick portion formed by the burring is reduced, thereby reducing the above-described non-uniformity of the tip of the convex portion of the thick portion.

Further, according to yet another aspect of the present invention, the method includes the steps of providing, in the plate-like body, a fitting hole for fitting a holding member having a mounting hole for inserting the columnar body; fitting the holding member into the fitting hole; inserting the columnar body into the mounting hole of the holding member to set the plate-like body and the holding member in an assembly position on an outer circumferential surface of the columnar body; and caulking for compressively pressing the holding member from an axial direction of the columnar body to plastically deform the holding member both inwardly and outwardly, namely, toward a center of the mounting hole and also toward an inner circumferential surface of the fitting hole of the plate-like body to tighten and fix the holding member to the outer circumferential surface of the columnar body and cause the holding member to spread within an inner circumferential part of the fitting hole of the plate-like body so as to be fixed thereto. Therefore, it is possible to assemble the plate-like body with the columnar body without sandwiching the plate-like body between a flange of a pin and a washer. Therefore, the caulked assembly can be made thin. Further, since it is not necessary to perform press-fitting as shown in FIGS. 44(a) and 44(b), and the caulking can therefore be performed by a single step, the assembly can be performed with high working efficiency as well as at a low cost. In addition, since the holding member is arranged around the straight columnar body as well as within the range of the plate thickness of the plate-like body, and then pressed, a thin caulked assembly with high accuracy can be obtained. Furthermore, since the assembly is performed by forming the mounting hole not in the plate-like body, but in the holding member, even a mounting hole having a diameter equal to or less than 0.5 mm can be easily processed by cutting work. Therefore, it is also possible to assemble a further slimmer columnar body with a plate-like body.

BRIEF DESCRIPTION OF THE DRAWINGS

FIGS. 3(a) to 3(c) are explanatory diagrams illustrating a thick portion;

FIGS. 5(a) to 5(c) are explanatory diagrams illustrating holes which are provided around a mounting hole;

FIGS. 11(a) and 11(b) are explanatory diagrams illustrating a modification of the manufacturing method of the second embodiment;

FIGS. 12(a) and 12(b) are explanatory diagrams illustrating another modification of the manufacturing method of the second embodiment;

FIGS. 13(a) and 13(b) are explanatory diagrams illustrating yet another modification of the manufacturing method of the second embodiment;

FIGS. 14(a) and 14(b) are explanatory diagrams illustrating yet another modification of the manufacturing method of the second embodiment;

FIGS. 15(a) and 15(b) are explanatory diagrams illustrating yet another modification of the manufacturing method of the second embodiment;

FIGS. 16(a) and 16 (b) are explanatory diagrams illustrating yet another modification of the manufacturing method of the second embodiment;

FIGS. 17(a) and 17(b) are explanatory diagrams illustrating yet another modification of the manufacturing method of the second embodiment;

FIGS. 18(a) and 18(b) are explanatory diagrams illustrating a manufacturing method of a caulked assembly according to a third embodiment of the present invention;

FIGS. 21(a) and 21(b) are explanatory diagrams illustrating another modification of the manufacturing method of the third embodiment;

FIGS. 35(a) and 35(b) are explanatory diagrams illustrating yet another modification of the manufacturing method of the fourth embodiment;

DESCRIPTION OF EMBODIMENTS

Figure 1:
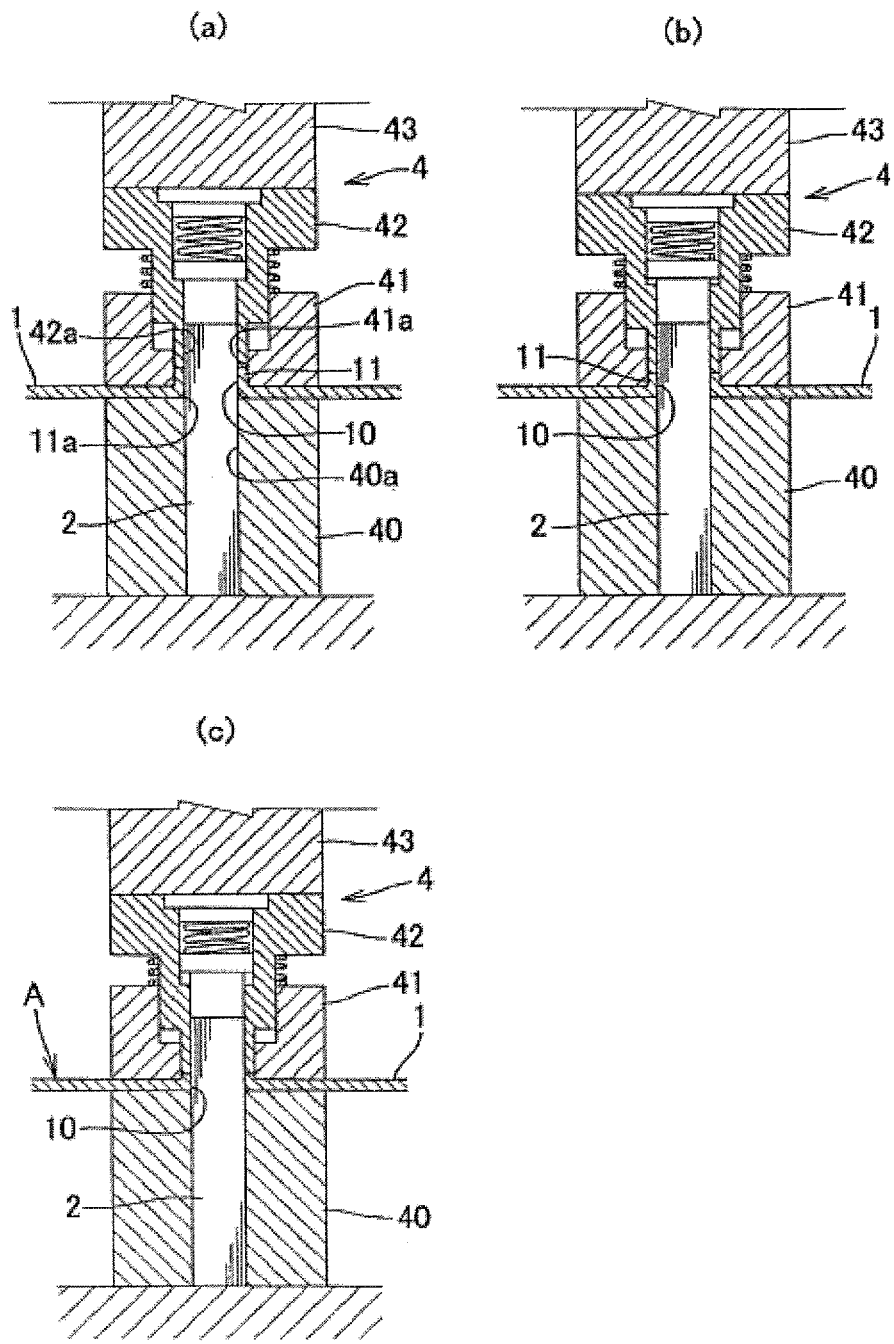
FIGS. 1(a) to 1(c) are explanatory diagrams illustrating a manufacturing method of a caulked assembly according to a first embodiment of the present invention.
Figure 2:
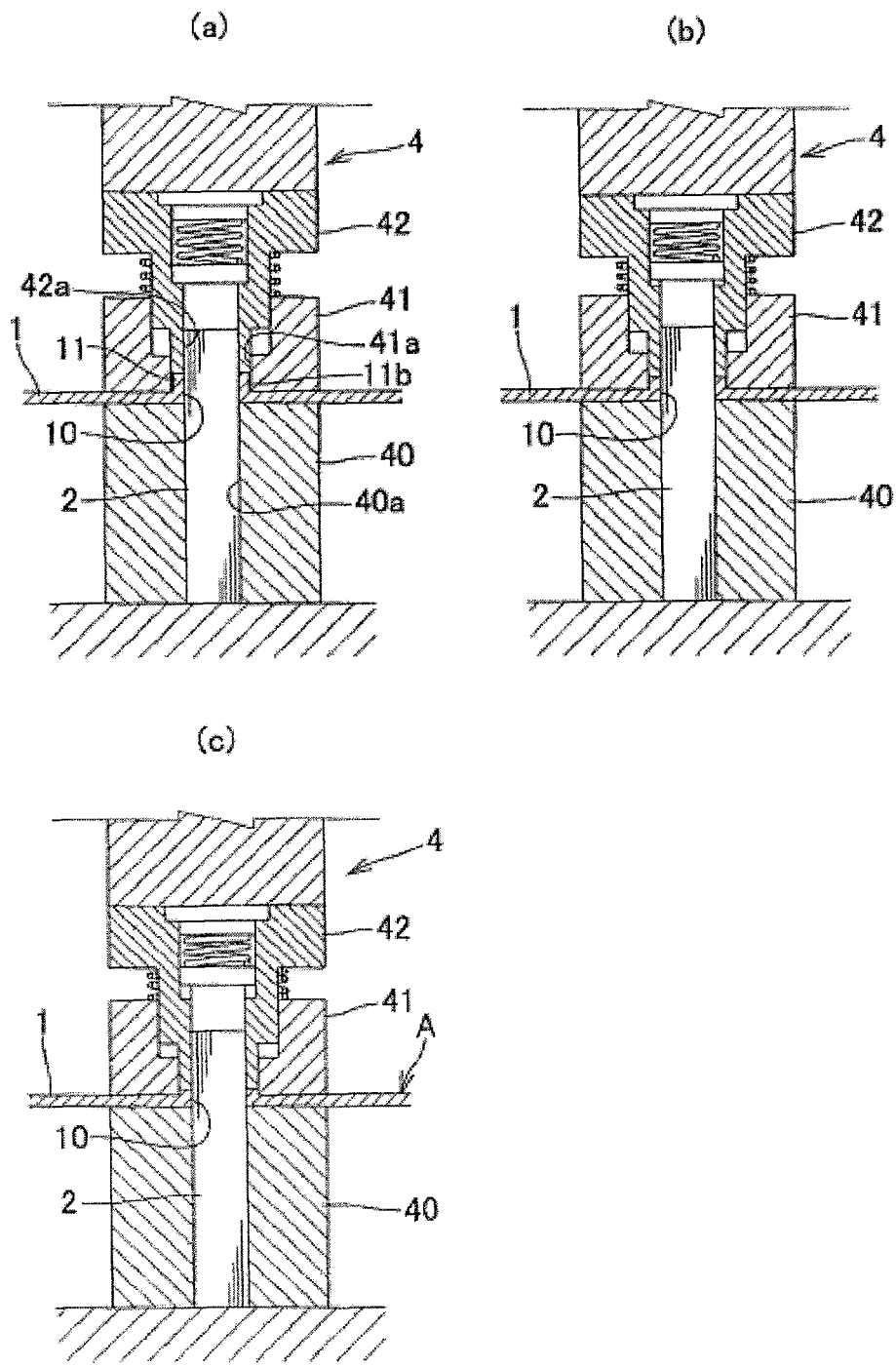
FIGS. 2(a) to 2(c) are explanatory diagrams illustrating a modification of the manufacturing method of the first embodiment.

First, the first embodiment of the present invention will be described with reference to FIG. 1(a) to FIG. 8(c).

In the present invention, a caulked assembly A of a metallic plate-like body 1 with a hollow or solid columnar body 2 is manufactured. In the present embodiment, as shown in FIGS. 1(a) to 1(c), a mounting hole 10 for inserting and assembling the columnar body 2 is provided in the metallic plate-like body 1, and a thick portion 11 is formed along an inner circumferential edge of the mounting hole 10. Thereafter, as shown in FIG. 1(a), the columnar body 2 is inserted into the mounting hole 10 of the plate-like body 1 so that the plate-like body 1 is set in an assembly position on an outer circumferential surface of the columnar body 2. Further, as shown in FIGS. 1(b) and 1(c), the thick portion 11 is compressively pressed from an axial direction of the columnar body 2 so as to be plastically deformed toward a center of the mounting hole 10 to thereby tighten and fix the thick portion 11 to the outer circumferential surface of the columnar body 2.

As just described, the present embodiment does not have a conventional structure in which a circumferential groove is formed on a columnar body, and a thick portion of a plate-like body is caused to bite into the circumferential groove, but has a structure in which the thick portion 11 is fixed to the outer circumferential surface of the columnar body 2 by pressure. Therefore, grooving for forming a circumferential groove is not required and the caulked assembly can therefore be manufactured at a low cost. In addition, reduction of the strength of the columnar body 2 can be prevented, which makes it possible to assemble the columnar body 2 which is slimmer than a conventional columnar body with the plate-like body 1. The caulked assembly A is suitable for electronic components or the like. However, the caulked assembly A can, of course, be applied to other various components and products. For example, the caulked assembly A can be utilized in various forms such as a form of an assembly of a support plate on which components such as a circuit and a fan motor are placed with a strut member in the internal structure of a product, and a form of an assembly of components themselves such as a plurality of cylindrical bodies with a base plate when a heat sink is constructed by assembling the columnar bodies with the base plate.

The columnar body 2 has a straight shape which does not have a flange portion to be locked with an upper surface or a lower surface of a circumferential edge of the mounting hole 10 of the plate-like body 1 in an end part and a midway part in the axial direction thereof. The columnar body 2 may also have another shape as long as it does not have a flange portion for locking. That is, as long as a region of the columnar body 2, the region being assembled to the plate-like body 1, has a straight shape having neither a circumferential groove nor a flange, the columnar body 2 may have a groove, a flange, a structure having a shape other than a shaft-like shape and the like in the other region thereof. Further, the columnar body 2 may be solid, or may also be a cylindrical body which is made by forming a thin plate into a cylindrical shape such as a frame of a motor vehicle and a pillar. As a material of the columnar body 2, various materials such as a synthetic resin, ceramics, wood, composite fiber can also be employed other than metal.

The mounting hole 10 for inserting and assembling the columnar body 2 is provided in the plate-like body 1. The thick portion 11 is formed along the inner circumferential edge of the mounting hole 10. Although, in the following description, the edge of the mounting hole 10 is raised into a cylindrical shape in a single direction by burring to thereby form the thick portion 11, the thick portion 11 may be formed by another processing. The plate-like body 1 has to include at least the mounting hole 10 which is formed in a plate-like part thereof and the thick portion 11 of the mounting hole 10, and may therefore include a structure having a shape other than a plate-like shape in the other part thereof.

Although, in the present embodiment, the mounting hole 10 of the plate-like body 1 on which the thick portion 11 is formed into a circular shape, and the columnar body 2 is a shaft body which is inserted and fitted into the mounting hole 10 and therefore includes the outer circumferential surface having a circular cross-sectional shape, the present invention is not limited to such a shape. For example, the plate-like body 1 can be assembled also with the columnar body 2 that has an irregular, arc, or square cross-sectional shape by forming the mounting hole 10 that has a shape corresponding to the shape of the columnar body 2. Further, the shapes of the plate-like body 1 and the columnar body 2 may not be the same as each other. For example, it is also preferred that the columnar body 2 have a polygonal cross-sectional shape and the mounting hole 10 have a circular shape which makes external contact therewith, the columnar body 2 have a circular cross-sectional shape and the mounting hole 10 have a polygonal shape which makes external contact therewith, and the like.

In the plate-like body 1 of the present embodiment, a thick portion is not caused to bite into a circumferential groove of a columnar body as in a conventional method. Therefore, even when the thin plate-like body 1 is thin and the thick portion 11 therefore has a small volume, the plate-like body 1 can be firmly fixed to the columnar body 2 by caulking with high strength, and the plate-like body 1 that is made thin to the limit of the holding accuracy can be assembled with the columnar body 2. Also, the columnar body 2 that is made slim to the limit of the hole processing of the mounting hole 10 of the plate-like body 1 can be assembled with the plate-like body 1.

Such caulking can be performed using a press apparatus 4 as shown in FIGS. 1(*a*) to 1(*c*). In the present embodiment, the press apparatus 4 is composed of a lower receiving tool 40 which includes a fitting hole 40*a* into which the columnar body 2 is fitted and supports a lower surface of the plate-like body 1 from which the thick portion 11 does not protrude, an upper receiving tool 41 which is arranged on an upper surface of the plate-like body 1 and includes a fitting hole 41*a* defined by an inner circumferential surface thereof which comes into contact with an outer circumferential surface of the thick portion 11 and an outer circumferential surface of a press tool 42 which presses the thick portion 11, the press tool 42 which includes an insertion hole 42*a* through which the columnar body 2 is inserted and is slidingly guided in a vertical axis direction along the inner circumferential surface of the fitting hole 41*a* of the upper receiving tool 41 to thereby apply pressure on the thick portion 11 in the axial direction from top to down, and a pressure applying tool 43 which applies pressure on the thick portion 11 by moving the press tool 42 downward.

By operating the pressure applying tool 43 to thereby move the press tool 42 downward, as shown in FIGS. 1(*a*) to 1(*c*), the press tool 42 presses the thick portion 11 downward. Accordingly, the thick portion 11 whose position is restricted by an upper surface of the lower receiving tool 40 and the inner circumferential surface of the fitting hole 41*a* of the upper receiving tool 41 is plastically deformed toward the center of the mounting hole 10 and thereby fixed to the outer circumferential surface of the columnar body 2 by pressure. As a result, the caulked assembly A (FIG. 1(*c*)) in which the plate-like body 1 and the columnar body 2 are firmly integrated with each other can be obtained.

The press apparatus 4 is not limited to the above structure as long as it can compressively press the thick portion 11 from the axial direction to thereby plastically deform the thick portion 11 toward the center of the mounting hole 10 so that the thick portion 11 is fixed to the outer circumferential surface of the columnar body 2 by pressure. For example, although pressure is applied to the press tool 42 by the pressure applying tool 43 and the applied pressure is received by the lower receiving tool 40 in the present embodiment, pressure may also be applied to the lower receiving tool 40 by a pressure applying tool. The columnar body 2 is biased downward by a spring so as to prevent uplift thereof.

Further, as shown in FIGS. 1(*a*) and 3(*a*), a bent corner 11*a* on the inner circumference of the mounting hole 10 is formed into an R shape due to shear drop at the time of burring, and a space between the corner 11*a* and the apparatus serves as a caulking strength adjustable range in the present embodiment. That is, the strength adjustable range can be determined as a range from the start of filling of the space by deformation of the thick portion 11 until the completion of the filling. The space may be a tiny space. Further, the corner 11a may have a shape other than an R shape. For example, as shown in FIG. 3(b), it is also preferred to form the corner 11a into a C-surface shape by sheet metal processing to thereby form a space in the same manner as above. Further, it is also preferred to combine an R shape with a C-surface shape so that the adjustable range is made broader.

Further, even when the corner 11a is not formed into the above R shape or C-surface shape as shown in FIG. 3(c), by setting a space between the outer circumferential surface 11b of the thick portion 11 and the inner circumferential surface of the fitting hole 41a of the upper receiving tool 41 of the press apparatus 4 as shown in FIG. 2(a), for example, the thus set space can also serve as the strength adjustable range in the same manner as above.

Figure 4:
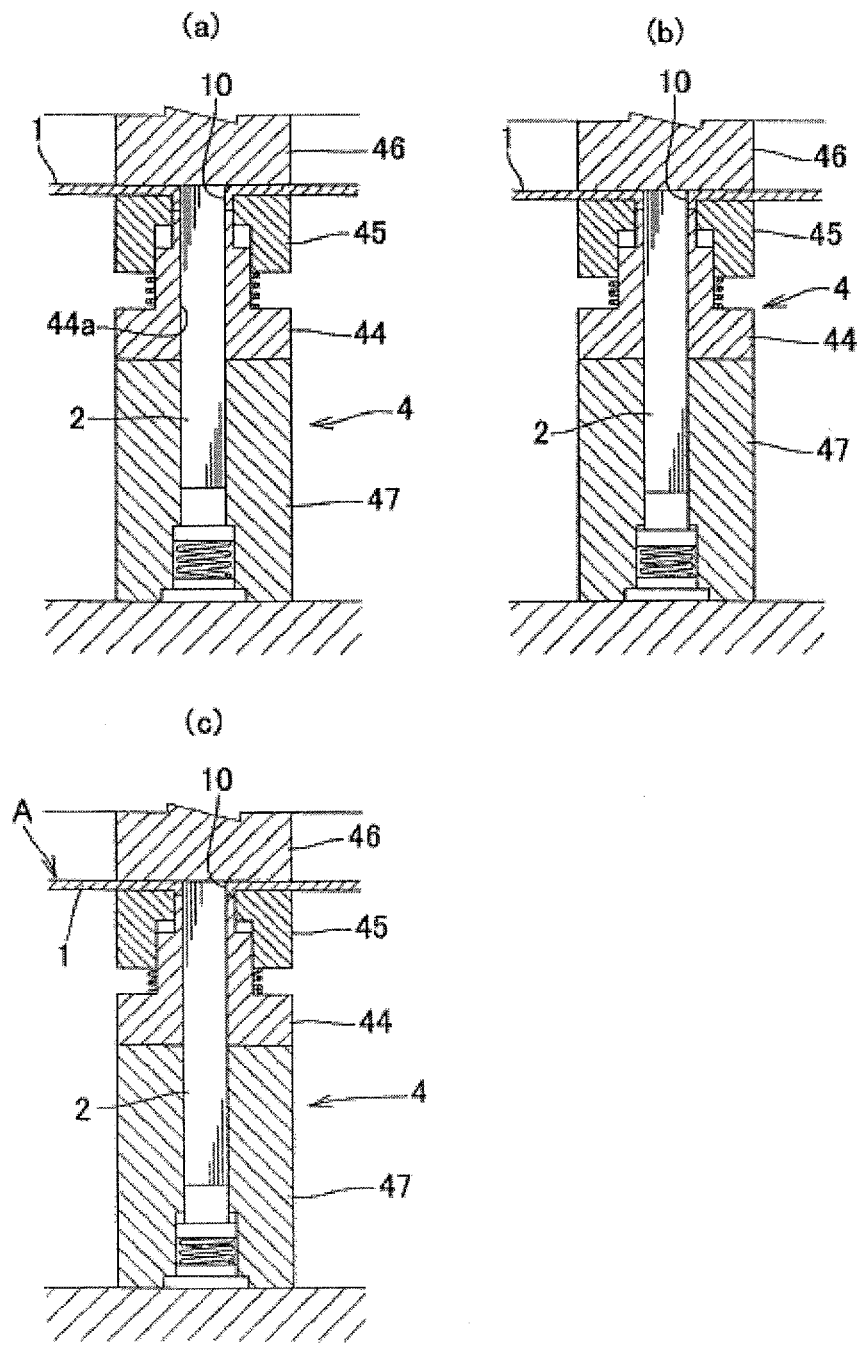
FIGS. 4(a) to 4(c) are explanatory diagrams illustrating another modification of the manufacturing method of the first embodiment.

In the above embodiment and the modifications thereof, the plate-like body 1 is assembled to the midway part of the columnar body 2. However, as shown in FIGS. 4(a) to 4(c), it is also possible to obtain the caulked assembly A in which the plate-like body 1 is assembled to an end part of the columnar body 2 so that an upper end surface of the columnar body 2 is made flush with the upper surface of the plate-like body 1 in the same manner as above. In the modification of FIG. 4, the press apparatus 4 is composed of a first lower receiving tool 44 which includes a fitting hole 44a into which the columnar body 2 is fitted and supports the thick portion 11 of the plate-like body 1 in the axial direction, the thick portion 11 cylindrically protruding downward at the upper end of the columnar body 2, a second lower receiving tool 45 which is arranged on the lower surface of the plate-like body 1, includes a fitting hole 45a defined by an inner circumferential surface thereof which comes into contact with the outer circumferential surface of the thick portion 11 and an outer circumferential surface of the first receiving tool 44 which supports the thick portion 11, and is slidingly guided in the vertical axis direction along the outer circumferential surface of the first lower receiving tool 44, and a press tool 46 which applies pressure on the upper end surface of the columnar body 2 and the upper surface of the plate-like body 1 in the axial direction from top to down.

By moving the press tool 46 downward, as shown in FIGS. 4(a) to 4(c), the press tool 46 presses down the plate-like body 1, the columnar body 2, and the second lower receiving tool 45 in an integrated manner, and only the thick portion 11 is thereby compressively pressed between the press tool 46 and an upper end surface of the first lower receiving tool 44 which does not move. Accordingly, the thick portion 11 whose position is restricted by the upper end surface of the first lower receiving tool 44 and the inner circumferential surface of the fitting hole 45a of the second lower receiving tool 45 is plastically deformed toward the center of the mounting hole 10 and thereby fixed to the outer circumferential surface of the end part of the columnar body 2 by pressure. As a result, the caulked assembly A (FIG. 4(c)) in which the plate-like body 1 and the columnar body 2 are firmly integrated with each other can be obtained.

Further, such a press apparatus 4 is also not limited to the above structure as long as it can compressively press the thick portion 11 from the axial direction to thereby plastically deform the thick portion 11 toward the center of the mounting hole 10 so that the thick portion 11 is fixed to the outer circumferential surface of the columnar body 2 by pressure. For example, although pressure is applied to the press tool 46 and the applied pressure is received by the first lower receiving tool 44 in this modification, pressure may also, of course, be applied to the first lower receiving tool 44 by a pressure applying tool. The columnar body 2 and the second lower receiving tool 45 are biased upward by springs so as to integrally move downward with closely contacting with the lower surface of the press tool 46. Further, although the first lower receiving tool 44 is placed on a cylindrical base member 47, the base member 47 may also, of course, be integrally formed with the first lower receiving tool 44.

Further, as shown in FIGS. 5(a) to 5(c), it is preferred to provide a plurality of holes 14 around the mounting hole 10 (the thick portion 11) of the plate-like body 1 so that an adverse effect caused by excessive caulking (such as reduction of the perpendicularity of the columnar body 2 and deformation of the plate-like body 1) can be prevented or reduced. The holes 14 are provided around the mounting hole 10 at regular intervals.

Further, it is also a preferred modification that a step portion 12 is formed around the mounting hole 10 of the plate-like body 1, and the thick portion 11 is formed in an inner circumferential region of the step portion 12 as shown in FIG. 6(a). As will be described later in a description of a second embodiment, the step portion 12 achieves the same function as the thick portion 11 to be fixed to the outer circumferential surface of the columnar body 2 by pressure caulking by pressing a protruding side of the step portion 12 until the step is gone and becomes flat so that the step portion 12 is plastically deformed inwardly. However, in this modification, the step portion 12 is not pressed in this manner, and only the thick portion 11 is plastically deformed. The step portion 12 in this modification is used for positioning the press apparatus 4.

Specifically, as shown in FIGS. 6(b) and 6(c), a fitting convex portion 40c which is fitted into a depressed receiving portion 12b on a lower surface of the step portion 12 is formed on an upper surface of the lower receiving portion 40. Further, a notched groove 41c which is fitted into a convex portion 12a on an upper surface of the step portion 12 is formed on a lower surface of the upper receiving tool 41. The other configurations are the same as those shown in FIGS. 1(a) to 1(c). By operating the pressure applying tool 43 to thereby move the press tool 42 downward, as shown in FIGS. 6(b) and 6(c), the press tool 42 presses the thick portion 11 downward. Accordingly, the thick portion 11 whose position is restricted by the upper surface of the lower receiving tool 40 and the inner circumferential surface of the fitting hole 41a of the upper receiving tool 41 is plastically deformed toward the center of the mounting hole 10 and thereby fixed to the outer circumferential surface of the columnar body 2 by pressure. Such a configuration makes it possible to accurately assemble the columnar body 2 that is slimmer than the mounting hole 10 of the plate-like body 1 with the plate-like body 1 with the columnar body 2 positioned in the center of the mounting hole 10. The step portion 12 can be efficiently manufactured by half blanking of press working.

In an example shown in FIGS. 6(b) and 6(c), the plate-like body 1 is assembled to the midway part of the columnar body 2. However, as shown in FIGS. 7(a) and 7(b), the plate-like body 1 may be assembled to the end part of the columnar body 2 in the same manner as above by forming, on the lower surface of the press tool 46, a fitting convex portion 46c which is fitted into the depressed receiving portion 12b on the upper surface of the step portion 12, and forming, on the upper surface of the second lower receiving tool 45, a notched groove 45c which is fitted into the convex portion 12a on the lower surface of the step portion 12. The other configurations are the same as those of the modification shown in FIGS. 4(a)

to 4(c). Further, it is also preferred to achieve the same function as the thick portion 11 to be fixed to the outer circumferential surface of the columnar body 2 by pressure caulking by pressing the protruding side of the step portion 12 so as to be plastically deformed inwardly, in the same manner as in the second embodiment. Such a modification overlaps with the second embodiment, and is effective in caulking of a slimmer shaft because the plastically deformed step portion 12 serves as a filler in addition to the thick portion 11 in this manner. That is, although when a slim shaft that has a diameter smaller than the diameter of a mounting hole is assembled to a plate-like body, the volume of a thick portion for filling a space between the slim shaft and the mounting hole may be insufficient when the thick portion is formed by burring, it is possible to cover the shortfall volume by crushing the step portion 12 formed by half blanking. Specifically, as shown in FIGS. 8(a) to 8(c), the above modification can be achieved in such a manner that a press tool is divided into two tools, namely, the press tool 42 for pressing the thick portion 11 and a press tool 42A for pressing the step portion 12, the thick portion 11 is first plastically deformed by the press tool 42, and the press tool 42A then further moves downward in conjunction with the press tool 42 to thereby press the step portion 12.

Figure 36:
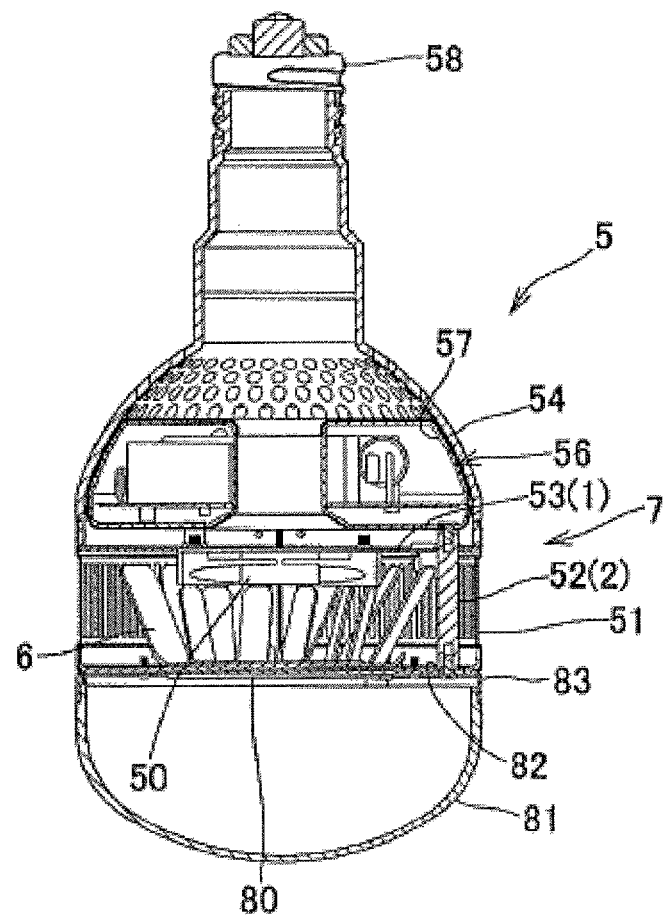
FIG. 36 is an explanatory diagram illustrating a specific embodiment of the caulked assembly manufactured by the manufacturing method of the first embodiment.
Figure 37:
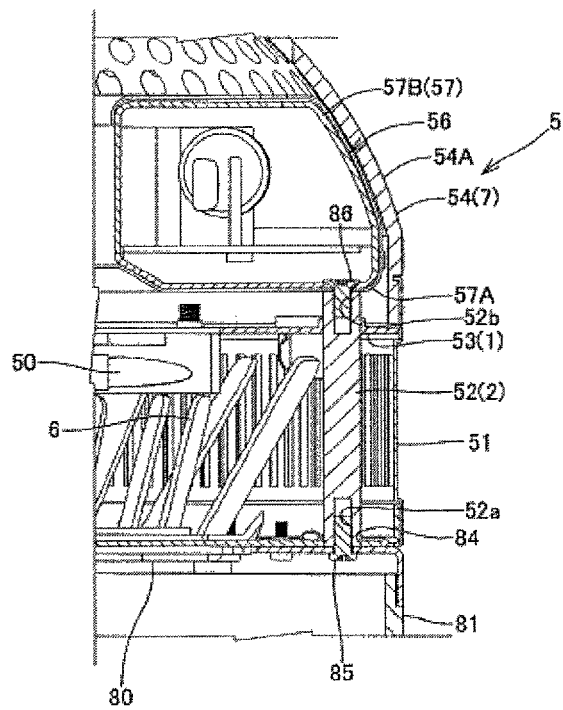
FIG. 37 is a cross-sectional view of a principal part of the caulked assembly of FIG. 36.
Figure 38:
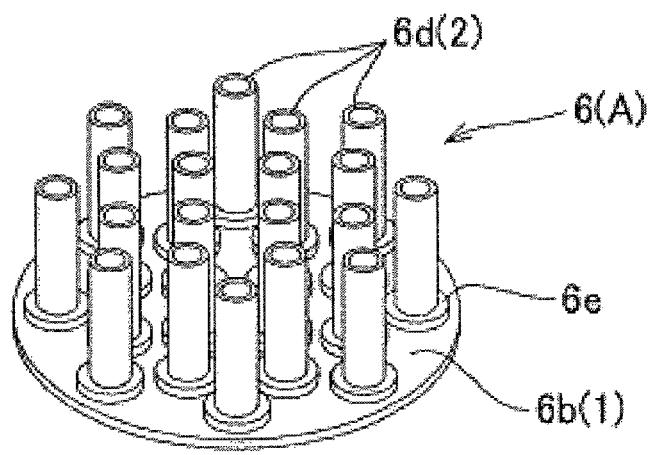
FIG. 38 is an explanatory diagram illustrating a specific embodiment of the caulked assembly manufactured by the manufacturing method of the first embodiment.
Figure 39:
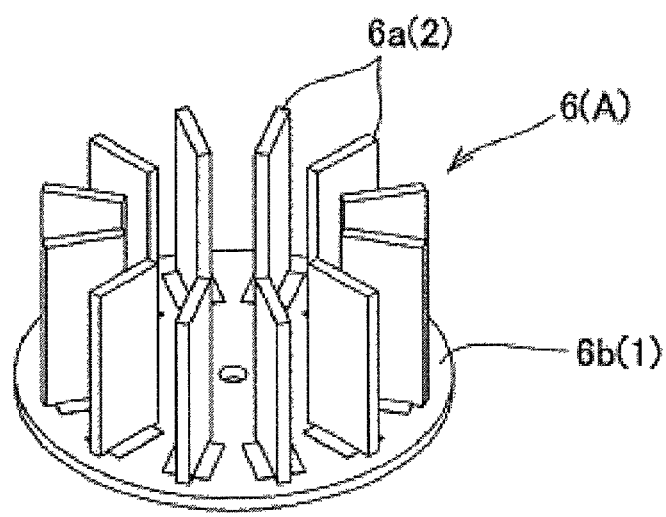
FIG. 39 is an explanatory diagram illustrating a specific embodiment of the caulked assembly manufactured by the manufacturing method of the second embodiment.
Figure 40:
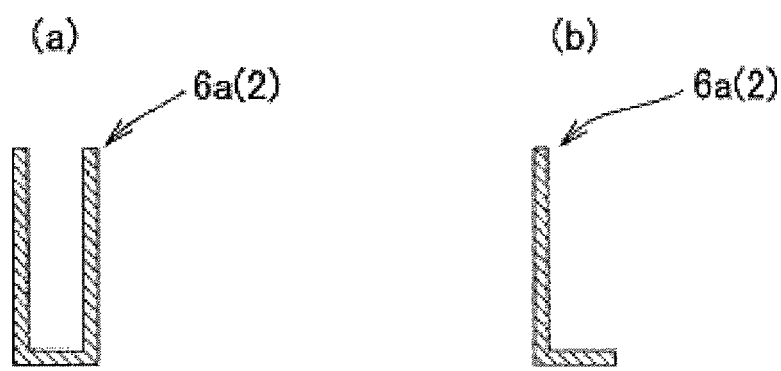
FIGS. 40(a) and 40(b) are explanatory diagrams each illustrating a modification of the columnar body of the second embodiment.
Figure 41:
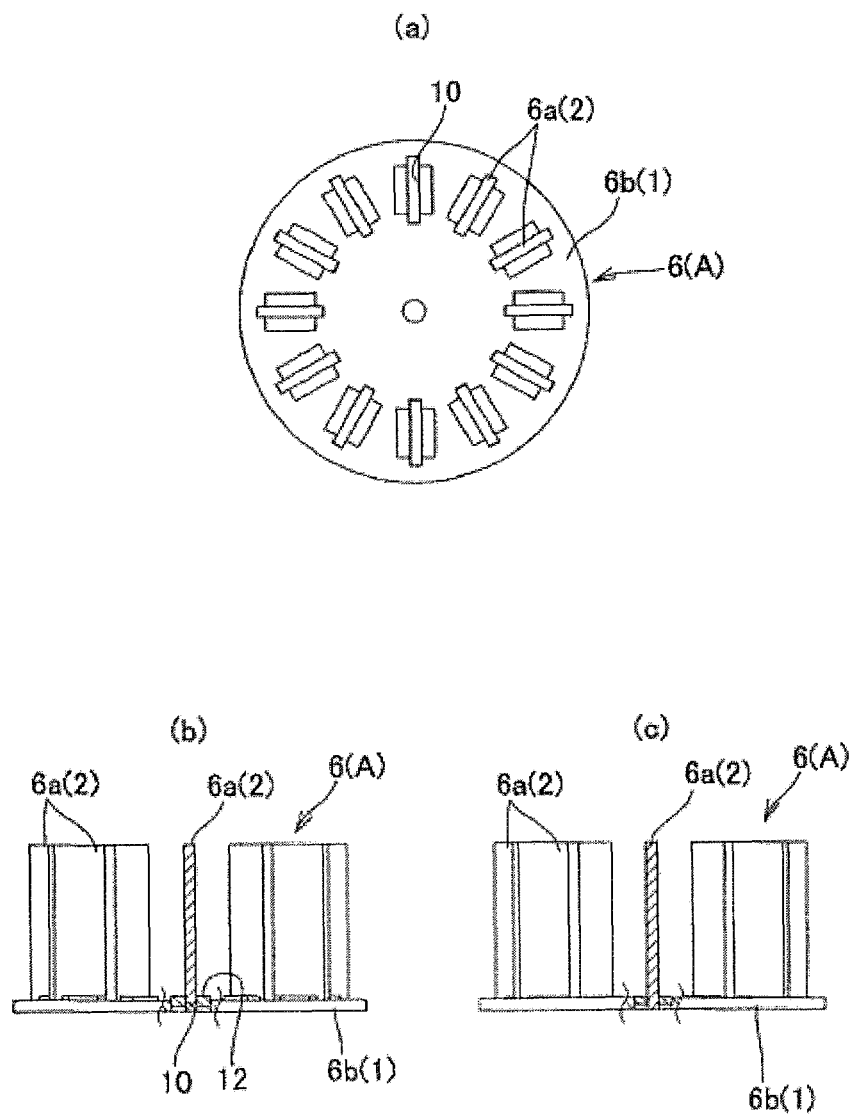
FIGS. 41(a) to 41(c) are explanatory diagrams illustrating the caulked assembly of the second embodiment.

FIGS. 36 to 38 illustrate a specific embodiment of the caulked assembly A according to the above-described manufacturing method of the first embodiment. FIG. 36 illustrates a bulb-type lighting device 5 which includes a lens body 81 covering a light source 80 at a distal end thereof and a base 58 to be connected to an external power supply at a base end thereof. The light source 80 is supported on a surface of a light source support base 82 which is made of a highly thermal conductive material such as aluminum, the surface facing the distal end of the lighting device 5 (hereinafter, referred to as "a distal end side surface"). Inlet/outlet ports are provided on a wall surface of a housing 7 at a position closer to the base end of the lighting device 5 than the light source support base 82. Further, a fan motor 50 is provided inside the housing 7. A forced air flow is generated in and out of the housing 7 by the fan motor 50 through the inlet/outlet ports. Heat generated from the light source 80 is released from a surface of the light source support base 82, the surface facing the base end of the lighting device 5 (hereinafter, referred to as "a base end side surface"), to the outside of the housing 7 by the forced air flow.

As shown in FIG. 37, in the light source support base 82, there are formed through holes 84 for allowing strut members 52 of a power supply circuit unit 56 to penetrate therethrough to fix the strut members 52 to a lens fixing member 83 by mounting screws 85. On the base end side surface of the light source support base 82, there is provided a heat sink member 6 which is made of a highly thermal conductive material such as aluminum. The housing 7 is composed of a first case 51 and a second case 54. The light source support base 82 is connected to a distal end of the first case 51. The base 58 is provided on a base end of the second case 54. Each of the inlet/outlet ports is provided on a side wall of each of the first case 51 and the second case 54. A support plate 53 which has an opening at a central part thereof and is made of a highly thermal conductive material such as aluminum is provided inside the first case 51 at a position close to a connection border between the first case 51 and the second case 54. Further, the fan motor 50 is fixed to the support plate 53 by mounting screws so as to close the opening.

Further, the power supply circuit unit 56 is arranged inside the housing 7. Heat generated from the power supply circuit unit 56 is also released to the outside of the housing 7 by the forced air flow generated by the fan motor 50. A resin case 57 is composed of a case main body 57A provided at the distal end side and a cover 57B provided at the base end side. The case main body 57A and the cover 57B are assembled with each other by mounting screws. The case main body 57A is connected to the base end side surface of the light source support base 82 by the strut members 52, so that the power supply circuit unit 56 is arranged inside the second case 54 at a position close to the connection border between the first case 51 and the second case 54.

The strut members 52 are caused to penetrate the support plate 53 of the fan motor 50, and the thus penetrated parts of the support plate 53 are fixed to the respective strut members 52 by the caulking method of the first embodiment. Further, the power supply circuit unit 56 is fixed to the thus penetrating end surfaces of the strut members 52, the end surfaces facing the base end of the lighting device 5. In this manner, the fan motor 50 and the power supply circuit unit 56 are supported by the strut members 52. The strut members 52 and the support plate 53 are caulked with each other, for example, by the caulking method as shown in FIGS. 1(a) to 3(c) in which through holes are provided in the support plate 53, the periphery of each of the through holes is made thick by burring, and the thick portion is compressed in the axial direction of each of the strut members 52 to thereby fix the support plate 53 to the strut members 52 by pressure. In addition, the various caulking methods of the first embodiment can be utilized. Further, caulking methods of later-described second, third and fourth embodiments can also, of course, be employed. One end of each of the strut members 52, the one end facing the distal end of the lighting device 5, penetrates a through hole 84 of the light source support base 82, and then comes into contact with the lens fixing member 83 and is fixed thereto by screwing a mounting screw 85 which penetrates a through hole provided in the lens fixing member 83 at a position corresponding to the contact position with each of the strut members 52 toward the base end of the lighting device into a screw hole 52a which is formed on one of end surfaces of each of the strut members 52. Further, the other end of each of the strut members 52, the other end facing the base end of the lighting device 5, comes into contact with the case main body 57A of the resin case 57 of the power supply circuit unit 56, and is fixed thereto by screwing a mounting screw 86 which penetrates a through hole provided in the case main body 57A at a position corresponding to the contact position with each of the strut members 52 toward the distal end of the lighting device 5 into a screw hole 52b which is formed on the other end surface of each of the strut members 52. In this embodiment, each of the strut members 52 is caulked with the support plate 53 at a position in which the screw hole 52b is formed. Even in the case of such caulking with a hollow shaft, it is possible to perform the assembly with sufficient strength without deformation of the shaft by means of the method of the first embodiment.

Further, FIG. 38 illustrates a modification of the heat sink member 6 of the lighting device 5 illustrated in FIGS. 36 and 37. In this modification, hollow or solid columnar bodies 6d each of which is made of a highly thermal conductive metal are used as fins. A plate-like base member 6b which constitutes a support and is also made of a highly thermal conductive metal is subjected to press working to thereby fix the columnar bodies 6d to the plate-like base member 6b by caulking, so that the columnar bodies 6d are provided in a standing manner on a surface of the plate-like base member 6b, the surface facing the base end of the lighting device 5. The columnar bodies 6d are fixed to the plate-like base member 6b by caulking, for example, in such a manner that, as shown in FIGS. 1(a) to 3(c), mounting holes for inserting and fixing the respective columnar bodies 6d are provided in the plate-like base member 6b which constitutes support, thick portions 6e are formed along inner circumferential edges of the mounting holes by burring, and the thick portions 6e are compressively pressed from the axial direction of the columnar bodies 6d with the columnar bodies 6d inserted into the respective mounting holes so that the thick portions 6e are plastically deformed toward the centers of the respective mounting holes to thereby fix the thick portions 6e to outer circumferential surfaces of the columnar bodies 6d by pressure. In addition, the various caulking methods of the first embodiment can be utilized. Further, caulking methods of the later-described second, third and fourth embodiments can also, of course, be employed.

Although each of the columnar bodies 6d is formed into a hollow pipe to increase the surface area thereof, each of the columnar bodies 6d may be solid. Further, in this modification, each of the columnar bodies 6d has a hollow pipe shape and penetrates the support (the plate-like base member 6b). Therefore, spaces on opposite sides of the plate-like base member 6b communicate with each other through the columnar bodies 6d. As a result, the columnar bodies 6d achieve a stack effect for circulating air from a part having a higher temperature to a part having a lower temperature, thereby making it possible to further facilitate cooling. In the structure of this modification, since the plate-like base member 6b (namely, bottoms of the columnar bodies 6d) is closely attached to the surface of the light source support member 82, there is no circulation of air and the stack effect does not, therefore, occur. However, it is possible to achieve the stack effect depending on the structure of a subject of cooling. Further, although not shown in the figures, by forming a hole which serves as an inlet for air on an outer wall of each of the columnar bodies 6d at a position near the bottom thereof, air is circulated inside the columnar bodies 6d due to the stack effect, thereby making it possible to enhance heat releasing effect for releasing heat within the columnar bodies 6d to the outside. Although a cross section of each of the columnar bodies 6d has a circular shape, the cross section may also, of course, have a quadrate shape, an elliptical shape, an irregular shape, and the like. Even in the calking of the hollow columnar bodies 6d with the plate-like base member 6b as performed in this modification, it is possible to assemble the columnar bodies 6d with the plate-like member 6b with sufficient strength without deformation of the columnar bodies 6d by means of the method of the first embodiment.

Next, the second embodiment of the present invention will be described with reference to FIGS. 9 to 17(b).

Figure 9:
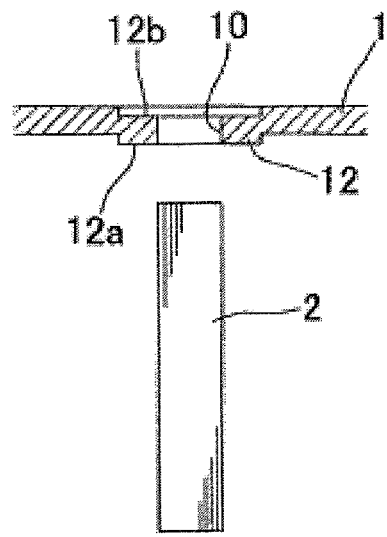
FIG. 9 is an explanatory diagram illustrating a manufacturing method of a caulked assembly according to a second embodiment of the present invention.

In the second embodiment, as shown in FIG. 9, a mounting hole 10 for inserting and assembling a columnar body 2 is provided in a metallic plate-like body 1, and a step portion 12 is formed around the mounting hole 10. As shown in FIG. 10(a), the columnar body 2 is inserted into the mounting hole 10 of the plate-like body 1 so that the plate-like body 1 is set in an assembly position on an outer circumferential surface of the columnar body 2. Further, as shown in FIG. 10(b), the step portion 12 is compressively pressed from an axial direction of the columnar body 2 so as to be plastically deformed toward a center of the mounting hole 10 to thereby tighten and fix an inner circumferential part of the mounting hole 10 to the outer circumferential surface of the columnar body 2. The step portion 12 can be efficiently manufactured by half blanking of press working.

Especially, in the present embodiment, since a depressed surface of the step portion 12 is determined as a receiving portion 12b, and the step portion 12 is deformed by applying pressure to the other protruding surface (a convex portion 12a), the columnar body 2 is firmly held in the center of the mounting hole 10 with the plate-like body 1 positioned by the receiving portion 12b. Therefore, even when the columnar body 2 is slimmer than the mounting hole 10, the columnar body 2 can be accurately and reliably assembled in the center of the mounting hole 10.

Specifically, as shown in FIGS. 10(a) and 10(b), a fitting convex portion 46c which is fitted into the receiving portion 12b of the step portion 12 is formed on a lower surface of a press tool 46. A first lower receiving tool 44 supports the convex portion 12a as well as a part of a second lower receiving tool 45 at an outer circumferential side thereof, the part not corresponding to the step portion 12. The other configurations are the same as those of the press apparatus 4 in the modification shown in FIGS. 4(a) to 4(c).

By moving the press tool 46 downward, as shown in FIGS. 10(a) and 10(b), the press tool 46 presses down the plate-like body 1, the columnar body 2 and the second lower receiving tool 45 in an integrated manner, and only the step portion 12 is thereby compressively pressed between the fitting convex portion 46c of the press tool 46 and an upper end surface of the first lower receiving tool 44 which does not move. Accordingly, the convex portion 12a of the step portion 12 whose position is restricted by the upper end surface of the first lower receiving tool 44 and an inner circumferential surface of a fitting hole 45a of the second lower receiving tool 45 is plastically deformed toward the center of the mounting hole 10 and thereby fixed to an outer circumferential surface of an end part of the columnar body 2 by pressure. As a result, the caulked assembly A (FIG. 10(b)) in which the plate-like body 1 and the columnar body 2 are firmly integrated with each other can be obtained. In this embodiment, the convex portion 12a is deformed so as to completely lose its shape. However, the convex portion 12a may also, of course, remain in some degree.

In this embodiment, the plate-like body 1 is assembled to the end part of the columnar body 2. However, it is also, of course, possible to assemble the plate-like body 1 to the midway part of the columnar body 2. In this case, as shown in FIGS. 11(a) and 11(b), in a press apparatus 4 having the same basic configuration as that of the press apparatus 4 of FIGS. 1(a) to 1(c), a fitting convex portion 40c is formed on a lower receiving tool 40, and the convex portion 12a is pressed by a press tool 42 in the same manner as above.

Further, as shown in FIGS. 12(a) and 12(b), it is also a preferred modification that a circumferential groove 20 having a predetermined depth is formed at the assembly position on the outer circumferential surface of the columnar body 2, and, in a caulking step, the step portion 12 is compressively pressed from the axial direction of the columnar body 2 so as to be plastically deformed toward the center of the mounting hole 10 to thereby tighten and fix an inner circumferential part 10a of the mounting hole 10 to the outer circumferential surface of the columnar body 2 as well as cause the inner circumferential part 10a to bite into the circumferential groove 20 as shown in FIG. 12(b).

Further, as shown in FIGS. 13(a) and 13(b), in a modification in which the fitting convex portion 46c of the press tool 46 is formed so as to protrude only into the outer circumferential side of the receiving portion 12b of the step portion 12 so that the fitting convex portion 46c is not completely fitted into the receiving portion 12b, but a space s1 is formed at the inner circumferential side thereof, the positioning of the plate-like body 1 can be performed by the fitting convex portion 46c which is fitted into the receiving portion 12b at the outer circumferential side thereof. In addition, the space s1 can be made to serve as the caulking strength adjustable range. Further, the convex portion 12a of the step portion 12 can be reliably deformed toward the center of the mounting hole 10 by leading the plastically deformed convex portion 12a into the space s1. Although, in order to enhance such an effect, an inner circumferential surface of the fitting convex portion 46c is formed into an inclined surface in this modification, the shape of the inner circumferential surface of the fitting convex portion 46c is not limited thereto. Further, the inclined surface of the inner circumferential surface of the fitting convex portion 46c also serves as a draft angle for making it easy to remove the fitting convex portion 46c from the receiving portion 12b after processing. Further, it is also preferred to form a drat angle also in the outer circumferential surface of the fitting convex portion 46c according to the need.

Also in this case, as shown in FIGS. 14(a) and 14(b), it is also preferred that the circumferential groove 20 having a predetermined depth be formed at the assembly position on the outer circumferential surface of the columnar body 2, and, in the caulking step, the step portion 12 be compressively pressed from the axial direction of the columnar body 2 so as to be plastically deformed toward the center of the mounting hole 10 to thereby tighten and fix the inner circumferential part 10a of the mounting hole 10 to the outer circumferential surface of the columnar body 2 as well as cause the inner circumferential part 10a to bite into the circumferential groove 20 as shown in FIG. 14(b).

Although, in the above embodiment and the modifications thereof, the step portion 12 is formed in a region leading to the inner circumferential surface of the mounting hole 10, the step portion 12 may be formed in a region that is separated from the inner circumferential edge of the mounting hole 10 so as to have a ring shape that is generally concentric with the mounting hole 10 as shown in FIGS. 15(a) and 15(b). FIGS. 16(a) and 16(b) illustrate a modification in which the circumferential groove 20 having a predetermined depth is further formed at the assembly position on the outer circumferential surface of the columnar body 2 in addition to the configuration of the modification shown in FIGS. 15(a) and 15(b), and the inner circumferential part 10a of the mounting hole 10 is tightened and fixed to the outer circumferential surface of the columnar body 2 as well as caused to bite into the circumferential groove 20. In FIGS. 16(a) and 16(b), a reference numeral 48 indicates a guide member for crushing the step portion 12 in the axial direction of the columnar body 2. In the modifications shown in FIGS. 13(a) to 16(b), since a span for holding the columnar body 2 can be made wide, the accuracy and the like are stable.

Further, as shown in FIGS. 17(a) and 17(b), it is also a preferred modification that a thick portion 11 is formed along the inner circumferential edge of the mounting hole 10 in addition to the step portion 12, and the step portion 12 and the thick portion 11 are compressively pressed to thereby fix the step portion 12 and the thick portion 11 to the outer circumferential surface of the columnar body 2 by pressure. In this case, a notched groove 44b which receives the thick portion 11 protruding further downward than the convex portion 12a is formed on the upper surface of the first lower receiving tool 44. Accordingly, as shown in FIGS. 17(a) and 17(b), both of the convex portion 12a of the step portion 12 and the thick portion 11 are deformed toward the center of the mounting hole 10 and thereby fixed to the outer circumferential surface of the columnar body 2 by pressure.

The columnar body, the plate-like body, the configuration of the press apparatus, and the modifications thereof of the second embodiment are basically the same as those of the first embodiment. Therefore, the same reference signs are used to refer to the same elements, and a description thereof will therefore be omitted. Especially, also in the embodiment and the modifications thereof shown in FIGS. 9 to 17(b), it is preferred to provide a plurality of holes as shown in FIGS. 5(a) to 5(c) around the mounting hole 10 and the step portion 12 of the plate-like body 1 so that an adverse effect caused by excessive caulking (such as reduction of the perpendicularity of the columnar body 2 and deformation of the plate-like body 1) can be prevented or reduced. Providing the holes in this manner is preferred especially when a columnar body that does not have a circumferential groove is assembled to a plate-like body by caulking. Further, the step portion 12 is not limited to one formed along the whole circumference of the mounting hole 10. For example, the step portion 12 may be formed in a part of the circumference of the mounting hole 10. Further, when the step portion 12 is formed in a part of the circumference of the mounting hole 10, the step portion 12 is not limited to one formed in a single location, but may be divided and formed in a plurality of locations. These forms of the step 12 are appropriately selected depending on the intended use. In particular, when caulking is performed on the step portion 12 divided and formed in a plurality of locations on the circumference of the mounting hole 10, tightening stress is reduced compared to the case where caulking is performed with the step portion 12 formed along the whole circumference of the mounting hole 10. As a result, an adverse effect caused by excessive caulking can be reduced as well as the caulking strength adjustable range is made broader. These forms can also be appropriately selected depending on the intended use.

FIGS. 39 to 43(f) illustrate specific embodiments of the caulked assembly A according to the manufacturing method of the above-described second embodiment, and modifications of the heat sink member 6 of the lighting device 5 illustrated in FIGS. 36 and 37. In these modifications, solid plate-like columnar bodies 6a each of which is made of a highly thermal conductive metal are used as fins. The plate-like base member 6b which constitutes a support and is also made of a highly thermal conductive metal is subjected to press working to thereby fix the columnar bodies 6a which are radially arranged to the plate-like base member 6b by caulking, so that the columnar bodies 6a are provided in a standing manner on a surface of the plate-like base member 6d, the surface facing the base end of the lighting device 5.

Figure 10:
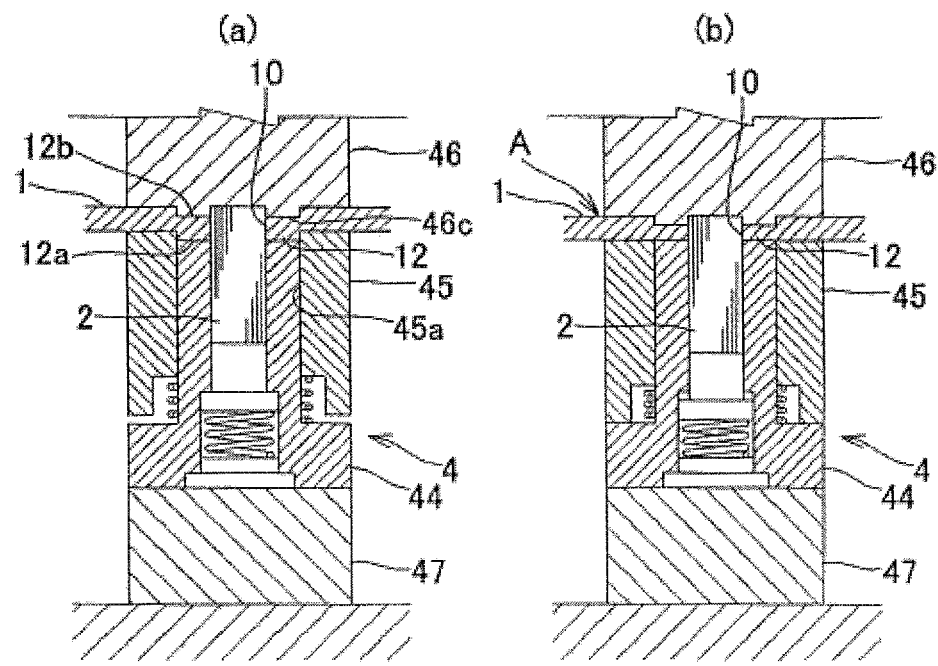
FIGS. 10(a) and 10(b) are explanatory diagrams illustrating an example of assembly of a columnar body with a plate-like body of FIG. 9.
Figure 19:
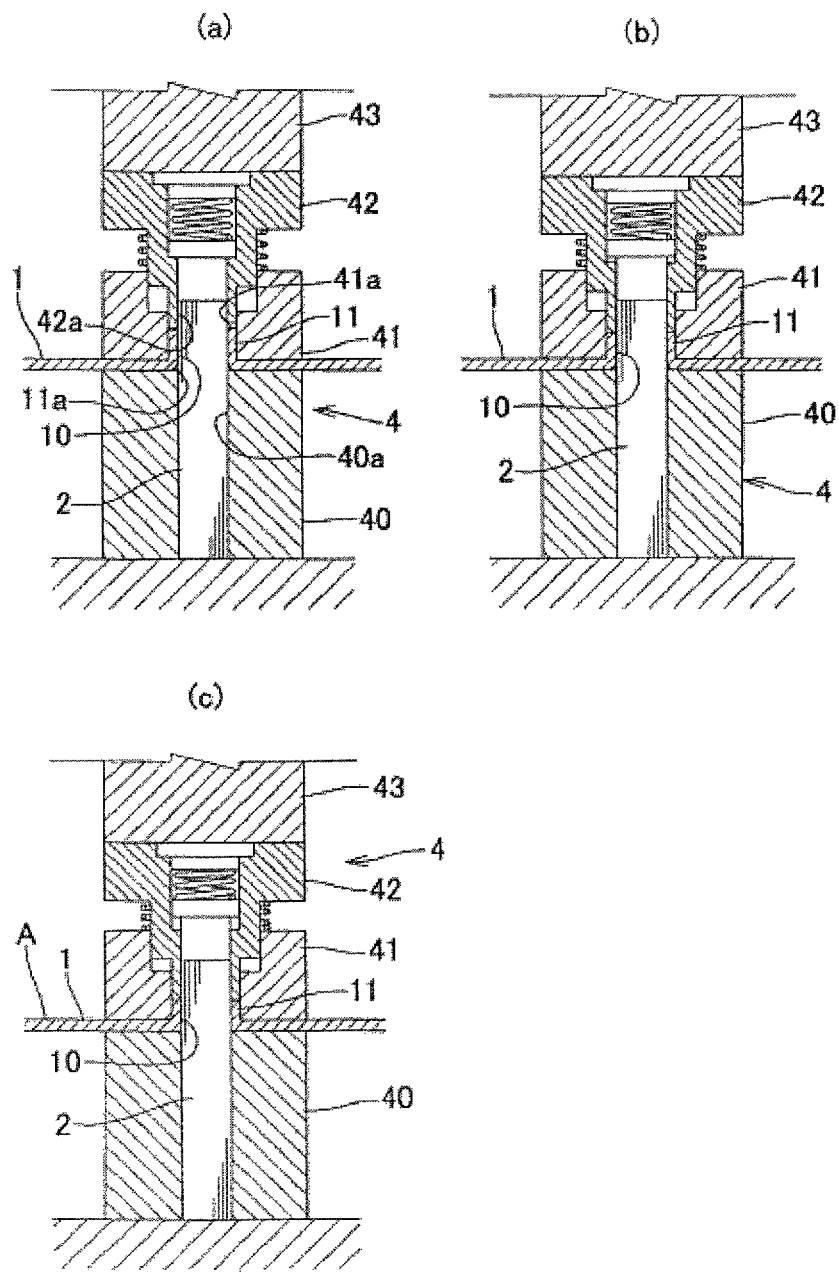
FIGS. 19(a) to 19(c) are explanatory diagrams illustrating an example of assembly of a columnar body with a plate-like body of FIGS. 18(a) and 18(b)
Figure 20:
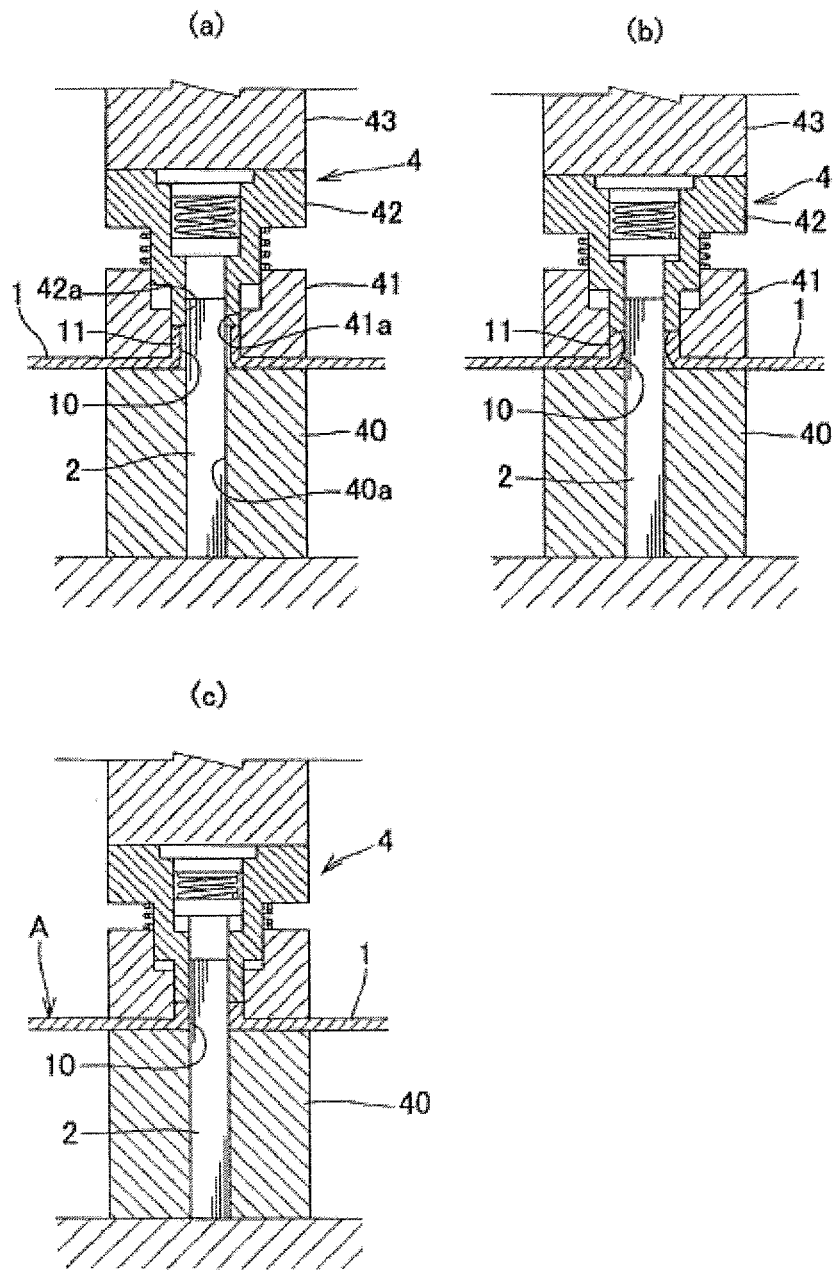
FIGS. 20(a) to 20(c) are explanatory diagrams illustrating a modification of the manufacturing method of the third embodiment.
Figure 22:
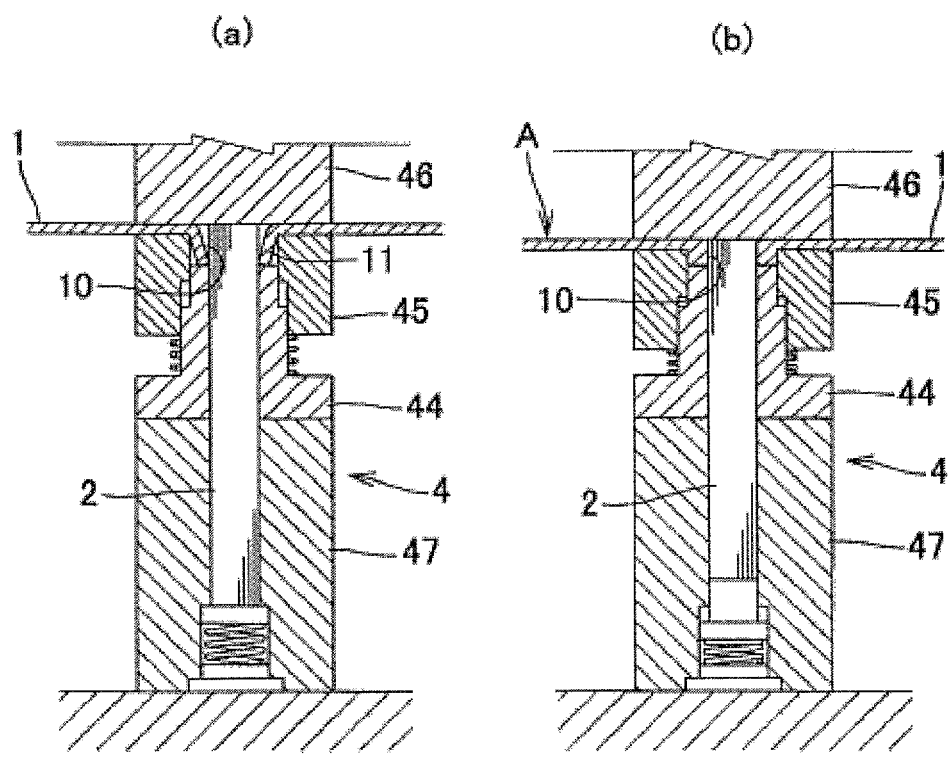
FIGS. 22(a) and 22(b) are explanatory diagrams illustrating yet another modification of the manufacturing method of the third embodiment.
Figure 23:
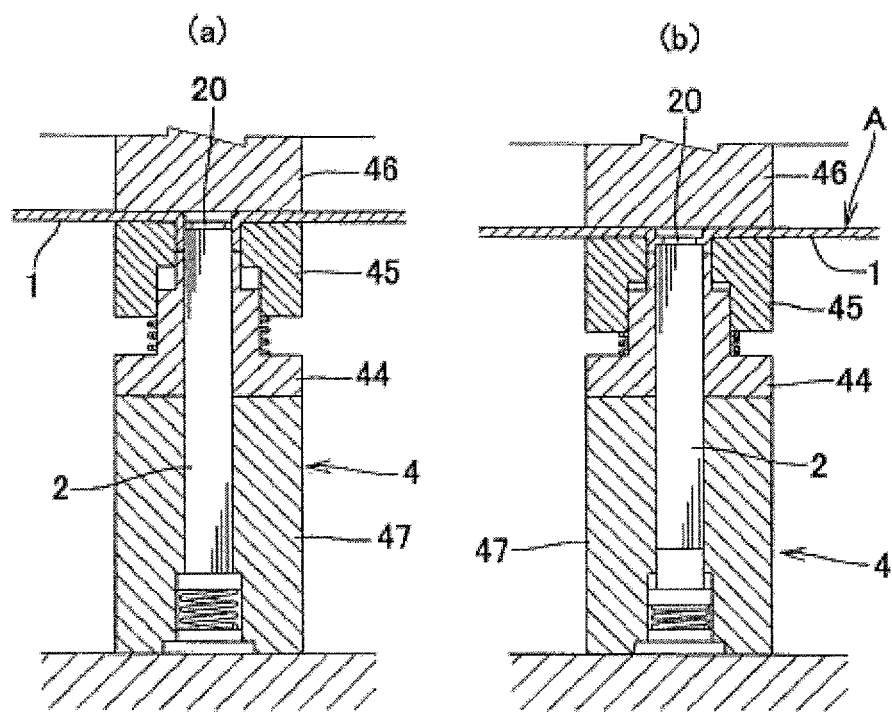
FIGS. 23(a) and 23(b) are explanatory diagrams illustrating yet another modification of the manufacturing method of the third embodiment.

The columnar bodies 6a are fixed to the plate-like base member 6b by caulking in the same manner as shown in FIGS. 9 to 10(b). That is, as shown in FIGS. 41(b) and 41(c), for example, the mounting holes 10 (square holes) for inserting and fixing the plate-like columnar bodies 6a are provided in the plate-like base member 6b which constitutes the support, and the step portions 12 are formed around the respective mounting holes 10. The plate-like columnar bodies 6a are inserted into the respective mounting holes 10 of the plate-like base member 6b and set in respective assembly positions. Then, each of the step portions 12 is compressively pressed from the axial direction of each of the columnar bodies 6a so as to be plastically deformed toward the center of each of the mounting holes 10 to thereby tighten and fix an inner circumferential part of each of the mounting holes 10 to the outer circumferential surface of each of the columnar bodies 6a as shown in FIG. 41(c). Further, by providing a through hole in a base end part of each of the plate-like columnar bodies 6a, the base end part being tightened and fixed to the plate-like base member 6b, each of the plastically deformed step portions 12 is caused to bite into the thus provided through hole, thereby making it possible to further enhance the supporting strength. Further, the caulking method of the first embodiment and caulking methods of the later-described third and fourth embodiments can also, of course, be employed.

Figure 42:
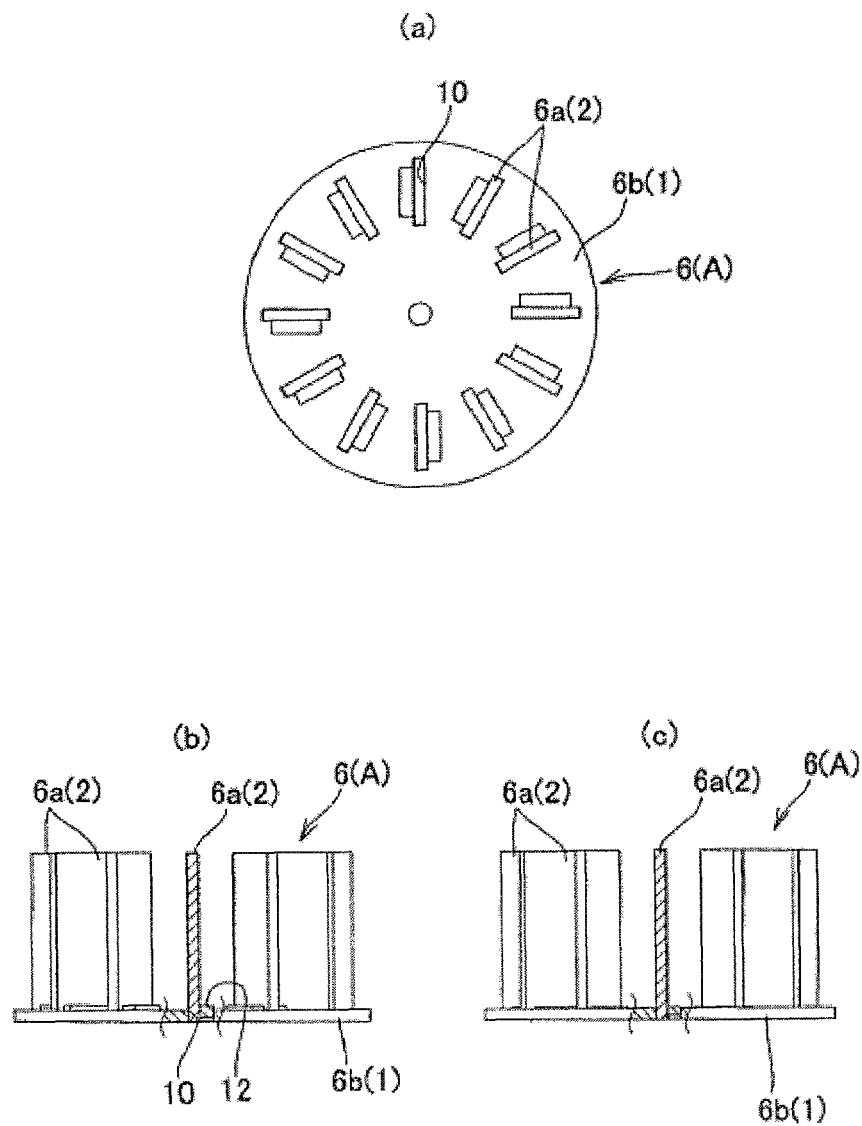
FIGS. 42(a) to 42(c) are explanatory diagrams illustrating a modification of the caulked assembly of the second embodiment.
Figure 43:
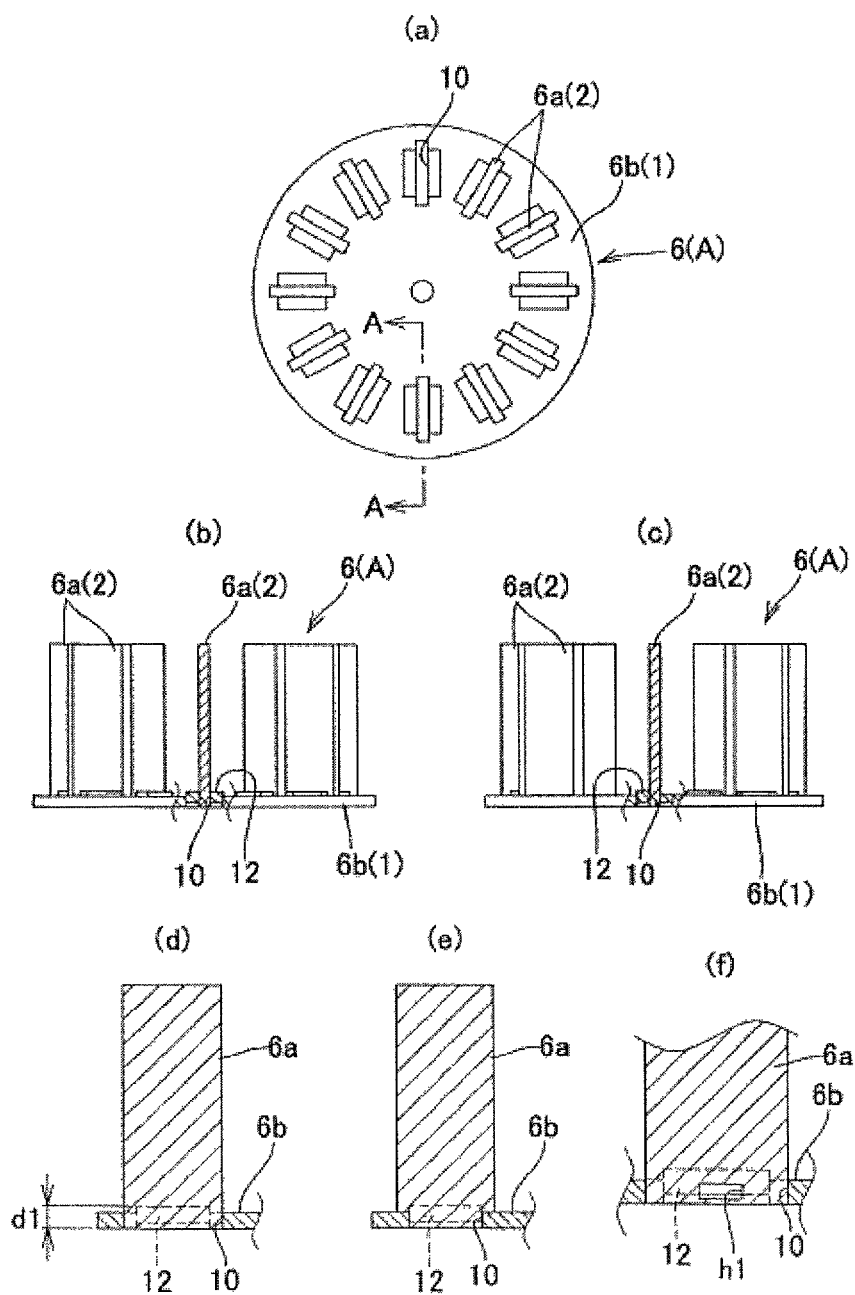
FIGS. 43(a) to 43(f) are explanatory diagrams illustrating another modification of the caulked assembly of the second embodiment.
Figure 44:
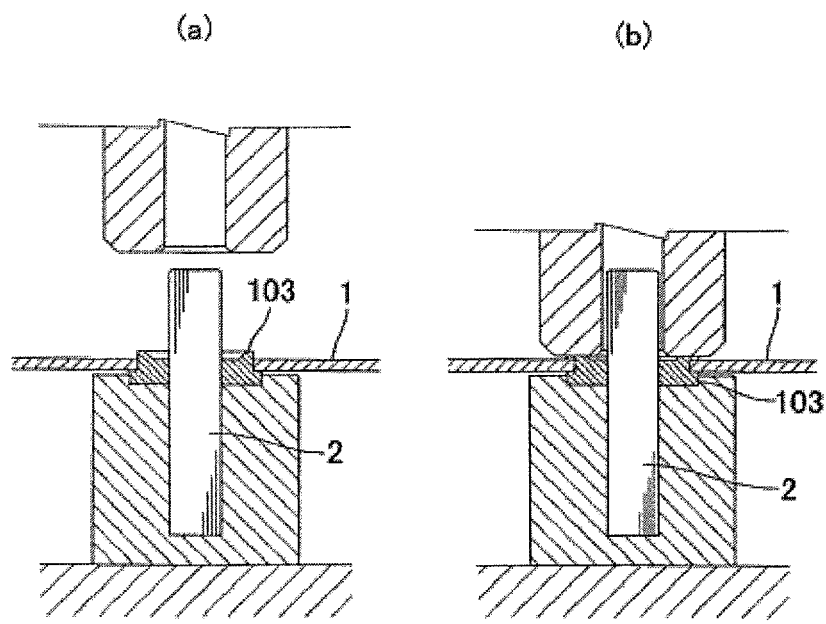
FIGS. 44(a) and 44(b) are explanatory diagrams illustrating a conventional manufacturing method using a press-fitting bush.

As shown in FIGS. 42(a) to 42(c), it is also a preferred modification that the step portion 12 formed by half blanking is formed around each of the square mounting holes 10 only at one side of each of the columnar bodies 6a, and the step portion 12 is therefore tightened and fixed from the one side. Accordingly, the inner surface of each of the mounting holes 10 at the other side is maintained as a cut surface. Therefore, excellent position accuracy and excellent perpendicularity of the columnar bodies 6a which are pressed against the inner surfaces of the mounting holes 10 are maintained. Further, it is also a preferred modification that, as shown in FIGS. 43(a) to 43(f), the step portions 12 are provided at both sides of each of the columnar bodies 6, and only one of the step portions 12 that is provided at one of the sides of each of the columnar bodies 6a is pressed to thereby tighten and fix the inner circumferential surface of each of the mounting holes 10 to each of the columnar bodies 6a only from the one side. In such a modification, the step portion 12 is formed also at the other side of the columnar body 6a, and both ends in the width direction of the columnar body 6a are positioned so as to correspond to both ends of the mounting hole 10. In addition, the step portion 12 is not formed on the both ends of each of the mounting holes 10 (In the modifications shown in FIGS. 41(a) to 43(f), each of the step portions 12 is provided not throughout the entire width of each of the columnar bodies 6a, but within a predetermined range in an intermediate part other than the both ends as shown in FIG. 43(d)). Therefore, the columnar body 6a is supported between a bottom surface of the support (the plate-like base member 6b) and an upper end of the step portion 12 at the other side (namely, a span d1 in FIG. 43(d)), and tightening pressure from the one side is applied within the span d1 as well as near the center of the columnar body 6a in the width direction thereof. Accordingly, the span d1 is made wider, and a good balance of pressure support is ensured, thereby further improving the accuracy. Although, in the modifications shown in FIGS. 41(a) to 43(f), the step portion 12 is configured so as to apply pressure to the predetermine range in the intermediate part of the columnar body 6a other than the both ends thereof, the width of the step portion 12 may be the same as the width of the columnar body 6a. For example, as shown in FIG. 43(e), it is also preferred to reduce only the width of the lower end part of the columnar body 6a which is inserted and fitted into the mounting hole 10 so that the width of the step portion 12 is made to be the same as the width of the lower end part of the columnar body 6a. Further, in a case where the columnar body 6a is in the form shown in FIG. 43(e), and a relationship between the mounting hole 10 and the step portion 12 is one shown in FIG. 43(d), it is needless to say that the columnar body 6a is supported within the span d1 in the same manner as above and the accuracy is therefore further improved. Further, the columnar body 6a may have a U-shaped or L-shaped cross section as shown in FIGS. 40(a) and 40(b) other than a straight plate-like shape. In this case, the columnar body 6a and the plate-like base member 6b can be fixed by caulking in such a manner that the mounting hole 10 is formed so as to have a size that is capable of inserting a wide region on the lower end part of the columnar body 6a, and, in the same manner as above, the step portion 12 of the plate-like base member 6b is plastically deformed and thereby fixed to the lower end part of the columnar body 6a by pressure. FIG. 43(f) illustrates a modification in which a concave portion h1 is provided in the columnar body 6a, and the step portion 12 is caused to bite into the concave portion h1. The concave portion h1 may or may not penetrate the columnar body 6a. The number and the shape of the concave portion h1 may be appropriately determined depending on the size or the intended purpose. Besides a square hole, a round hole, an irregular hole and the like can, of course, be employed as the shape of the concave portion h1.

Next, the third embodiment of the present invention will be described with reference to FIGS. 18(a) to 23(b).

In the present embodiment, as shown in FIGS. 18(a) and 18(b), a metallic plate-like body 1 in which a prepared hole is not provided is subjected to burring to thereby provide a mounting hole 10 for inserting and assembling a columnar body 2 and also form a thick portion 11 having a cylindrical shape along an inner circumferential edge of the mounting hole 10 by burring. Thereafter, in the same manner as in the first embodiment, the columnar body 2 is inserted into the mounting hole 10 of the plate-like body 1 so that the plate-like plate 1 is set in an assembly position on an outer circumferential surface of the columnar body 2 as shown in FIG. 19(a). Then, as shown in FIGS. 19(b) and 19(c), the thick portion 11 is compressively pressed from the axial direction of the columnar body 2 so as to be plastically deformed toward a center of the mounting hole 10 to thereby tighten and fix the thick portion 11 to the outer circumferential surface of the columnar body 2. Further, a depression 1a is formed on the plate-like body 1 of FIG. 18(a) at a position corresponding to the center of the mounting hole 10 to be formed so that burring can be substantially uniformly performed even without a prepared hole.

In an example shown in FIGS. 19(a) to 19(c), a caulked assembly can be manufactured using the same press apparatus 4 as that shown in FIGS. 1(a) to 1(c) of the first embodiment. Also, in the same manner as in the first embodiment, a bent corner 11a on the inner circumference of the mounting hole 10 is formed into an R shape due to shear drop at the time of burring, and a space between the corner 11a and the apparatus serves as the caulking strength adjustable range. Further, FIGS. 20(a) to 20(c) illustrate a modification in which the columnar body 2 that is slimmer than the mounting hole 10 is assembled to the plate-like body 1. The present embodiment is characterized in that, since there is no prepared hole in the plate-like body 1 as described above, it is possible to fix a columnar body that is made slim to the limit of obtaining necessary filling volume to the plate-like body 1 by caulking.

Also in the present embodiment, the plate-like body 1 can be assembled to the midway part of the columnar body 2, and can also be assembled to the end part thereof as with the above-described first and second embodiments. FIGS. 21(a) and 21(b) illustrate a modification in which the plate-like body 1 is assembled to an end part of the columnar body 2. Basically, the caulked assembly can be manufactured using the same press apparatus 4 as that shown in FIGS. 4(a) to 4(c) of the first embodiment. Further, as shown in FIGS. 22(a) and 22(b), it is also a preferred modification that the thick portion 11 is formed into a circular truncated cone shape which is tapered toward the tip thereof by burring. The columnar body 2 is inserted into the small-diameter tip part of the mounting hole 10. Accordingly, the expansion amount of the tip by burring is reduced, thereby reducing non-uniformity of the tip.

Figure 6:
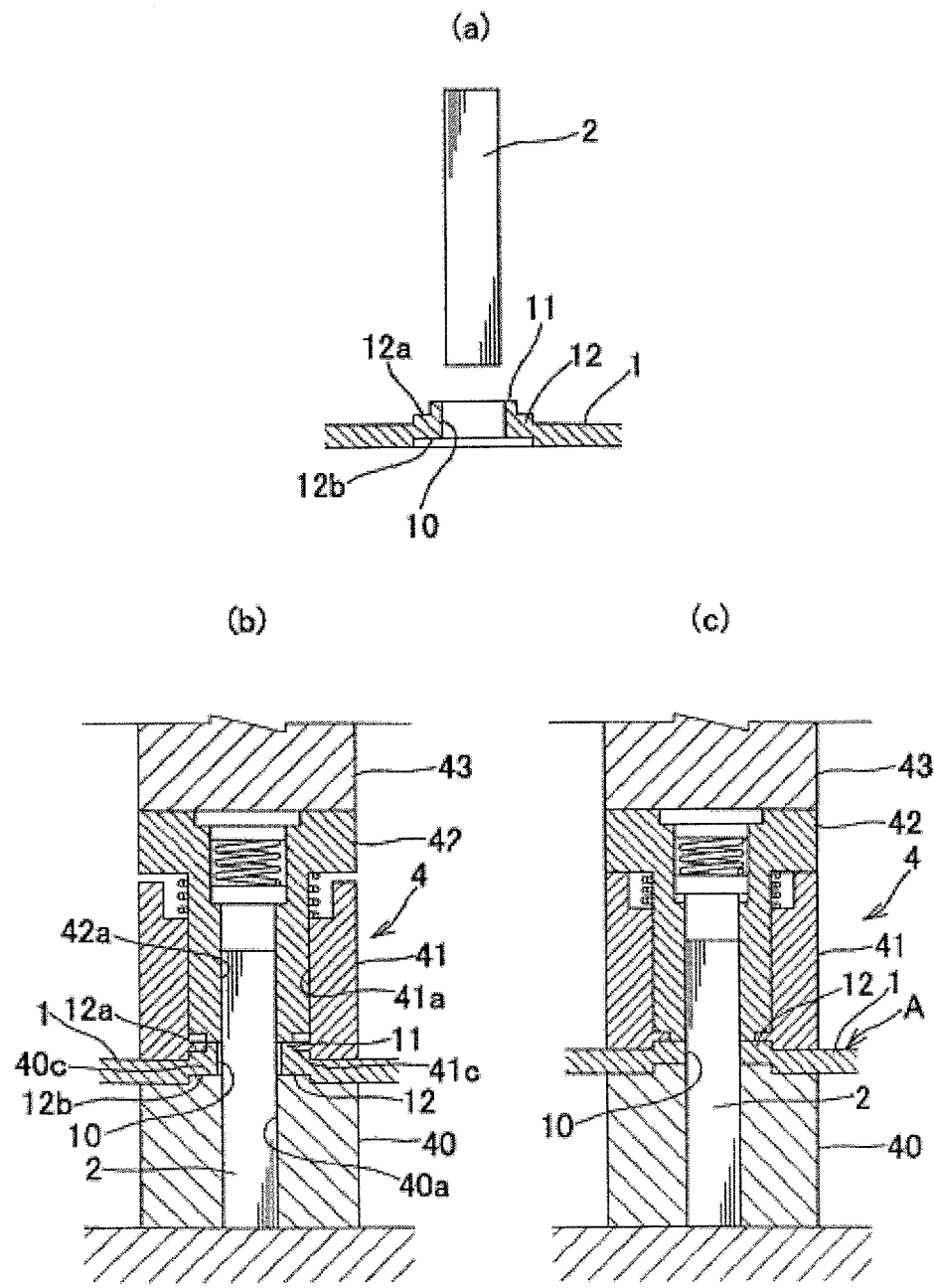
FIG. 6(a) is an explanatory diagram illustrating yet another modification of the manufacturing method of the first embodiment.
FIGS. 6(b) and 6(c) are explanatory diagrams illustrating an example of assembly of a columnar body with a plate-like body of FIG. 6 (a)
Figure 7:
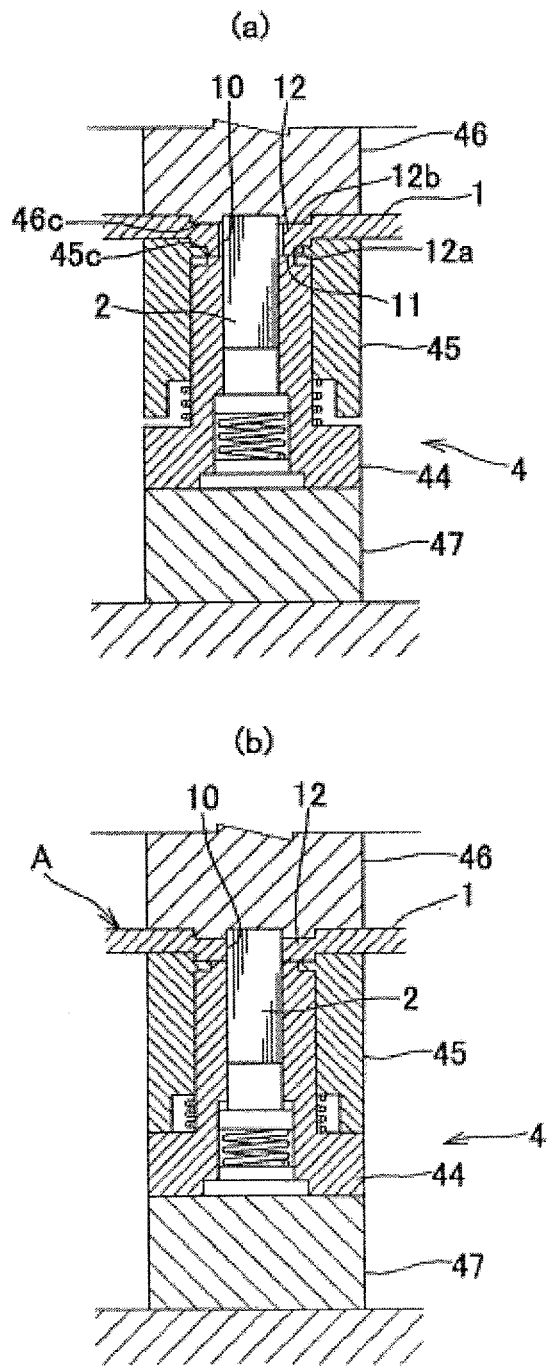
FIGS. 7(a) and 7(b) are explanatory diagrams illustrating yet another modification of the manufacturing method of the first embodiment.
Figure 8:
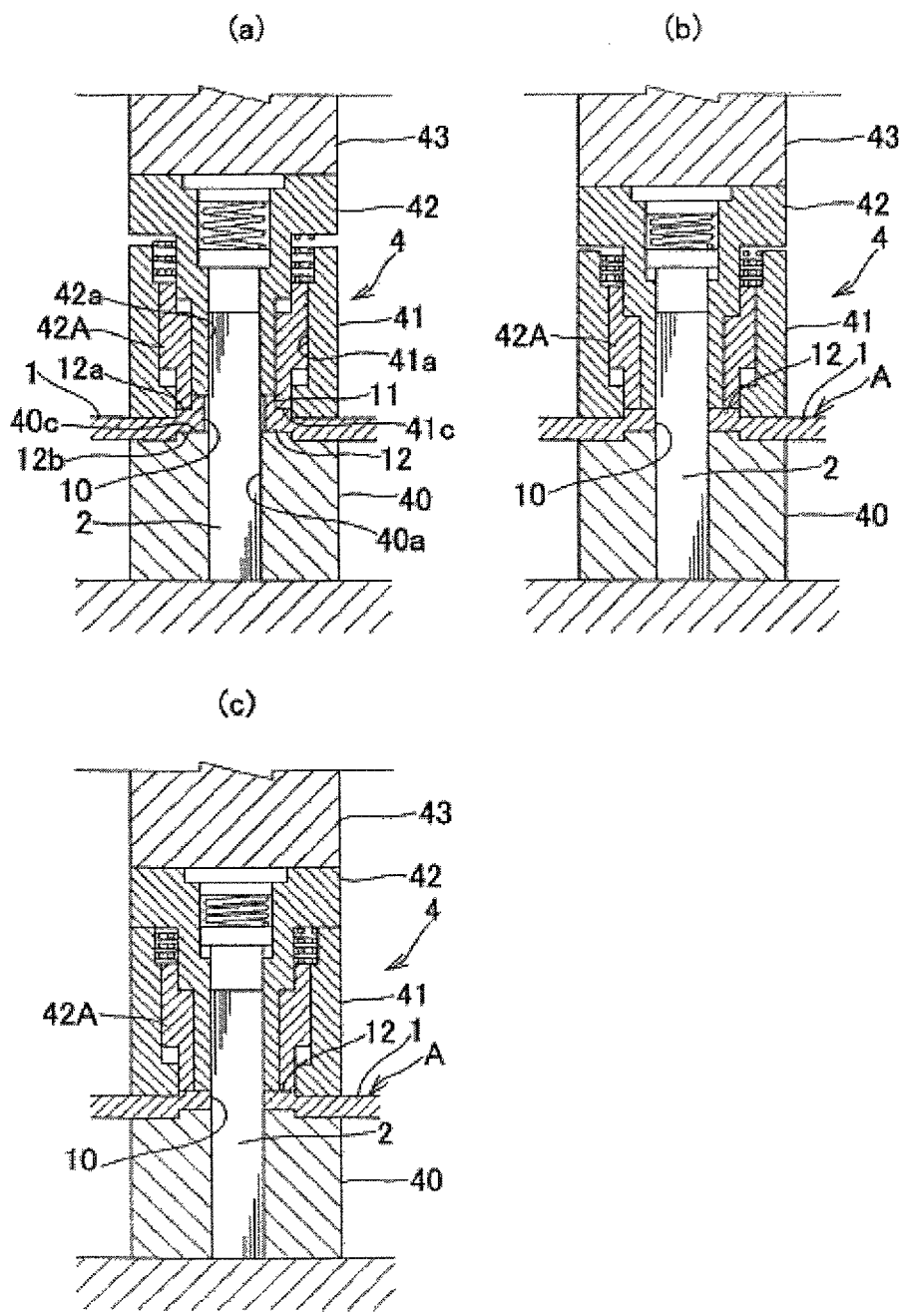
FIGS. 8(a) to 8(c) are explanatory diagrams illustrating yet another modification of the manufacturing method of the first embodiment.

Further, in the present embodiment, it is also a preferred modification that a circumferential groove 20 having a predetermined depth is formed in the assembly position on the outer circumferential surface of the columnar body 2, and, as shown in FIG. 23(b), in the caulking step, the thick portion 11 is compressively pressed from the axial direction of the columnar body 2 so as to be plastically deformed toward the center of the mounting hole 10 to thereby tighten and fix the thick portion 11 to the outer circumferential surface of the columnar body 2 as well as cause the thick portion 11 to bite into the circumferential groove 20 in the same manner as in the second embodiment. Since the burring is performed on the plate-like body 1 in which a prepared hole is not provided, an end surface of the thick portion 11 may be non-uniform as shown in FIG. 18(*b*). However, since the thick portion 11 is plastically deformed by applying pressure, such non-uniformity is made uniform after the caulking. Further, in a case where the columnar body 2 that is slimmer than the mounting hole 10 is assembled with the plate-like body 1, it is also a preferred modification that, in order to achieve high assembling accuracy, the step 12 as shown in FIGS. 6(*a*) to 6(*c*) is formed, and the columnar body 2 is positioned after positioning the plate-like body 1 as shown in FIGS. 7(*a*) and 7(*b*).

The columnar body, the plate-like body, the configuration of the press apparatus, and the modifications thereof of the third embodiment are also basically the same as those of the first embodiment. Therefore, the same reference signs are used to refer to the same elements, and a description thereof is therefore omitted.

Next, the fourth embodiment of the present invention will be described with reference to FIGS. 24(*a*) to 35(*b*).

Figure 24:
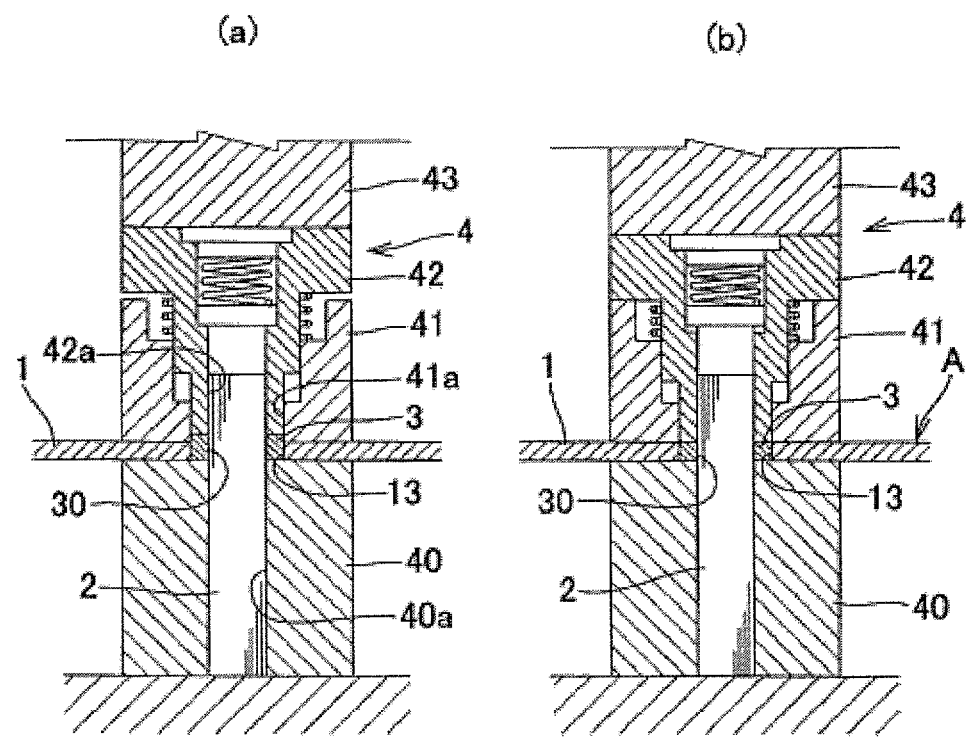
FIGS. 24(a) and 24(b) are explanatory diagrams illustrating a manufacturing method of a caulked assembly according to a fourth embodiment of the present invention.

In the present embodiment, as shown in FIGS. 24(*a*) and 24(*b*), a holding member 3 having a mounting hole 30 into which a columnar body 2 is inserted is interposed between a plate-like body 1 and the columnar body 2 to thereby assemble the plate-like body 1 with the columnar body 2 by caulking. In particular, a fitting hole 13 into which the holding member 3 is fitted is previously provided in the plate-like body 1, and the holding member 3 is fitted into the fitting hole 13. The columnar body 2 is then inserted into the mounting hole 30 of the holding member 3 as shown in FIG. 24(*a*) so that the plate-like body 1 and the holding member 3 are set in an assembly position on an outer circumferential surface of the columnar body 2. Thereafter, as shown in FIG. 24(*b*), the holding member 3 is compressively pressed from the axial direction of the columnar body 2 so as to be plastically deformed both inwardly and outwardly, namely, toward a center of the mounting hole 30 and also toward an inner circumferential surface of the fitting hole 13 of the plate-like body 1 to thereby tighten and fix the holding member 3 to the outer circumferential surface of the columnar body 2 as well as cause the holding member 3 to spread within an inner circumferential part of the fitting hole 13 of the plate-like body 1 so as to be fixed thereto.

This method is characterized in that a remaining part of a washer due to insufficient caulking is not generated, a plate-like body can be assembled with the columnar body that does not have a flange and the like, a caulked assembly can be made thin, and caulking can be performed by a single step without performing press-fitting, thereby making it possible to perform the assembly with high working efficiency as well as at a low cost, and also obtain a thin assembly with high accuracy. Basically, the same press apparatus 4 as that shown in FIGS. 1(*a*) to 1(*c*) of the first embodiment can be used. Instead of the thick portion 11, the holding member 3 is compressively pressed in the axial direction between the press tool 42 and the lower receiving tool 40. The holding member 3 is also preferably made of metal, but not limited thereto. The holding member 3 is preferably made of, for example, resin as appropriate. In this case, it is preferred to heat the caulking apparatus or apply ultrasonic vibration to plastically deform the holding member 3 with higher accuracy. In a case where the holding member 3 is made of metal, a metallic material that is easily plastically deformed such as brass and aluminum is preferably used. However, the material of the holding member 3 is not limited thereto, and can be appropriately selected according to the intended purpose such as holding strength and accuracy.

Figure 25:
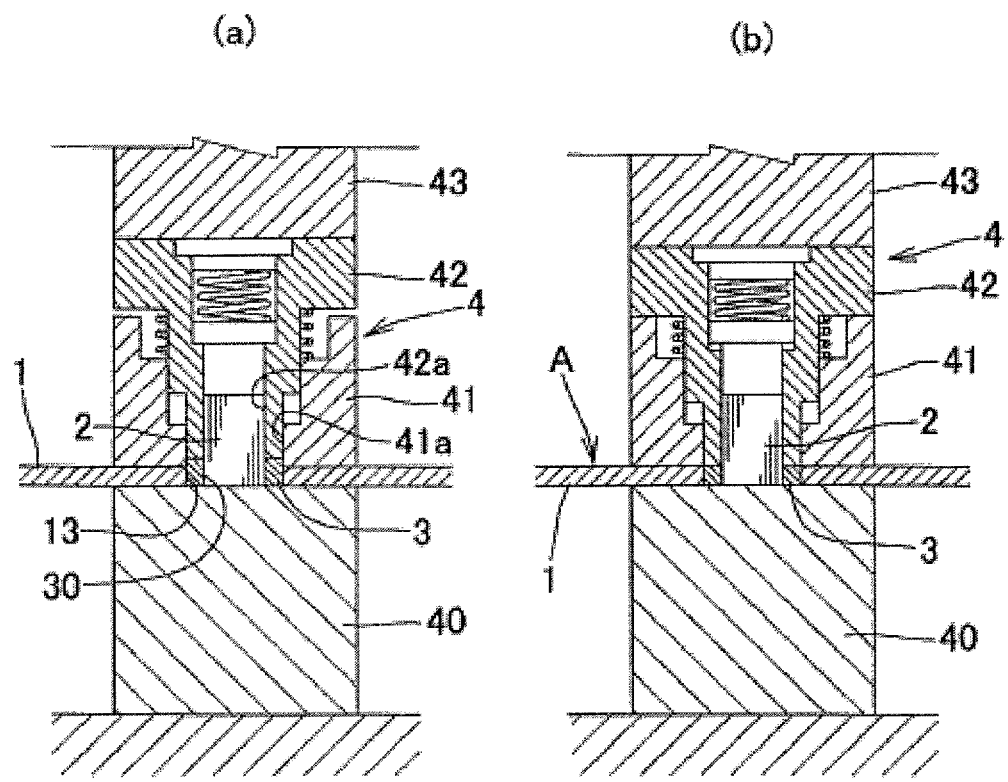
FIGS. 25(a) and 25(b) are explanatory diagrams illustrating a modification of the manufacturing method of the fourth embodiment.
Figure 26:
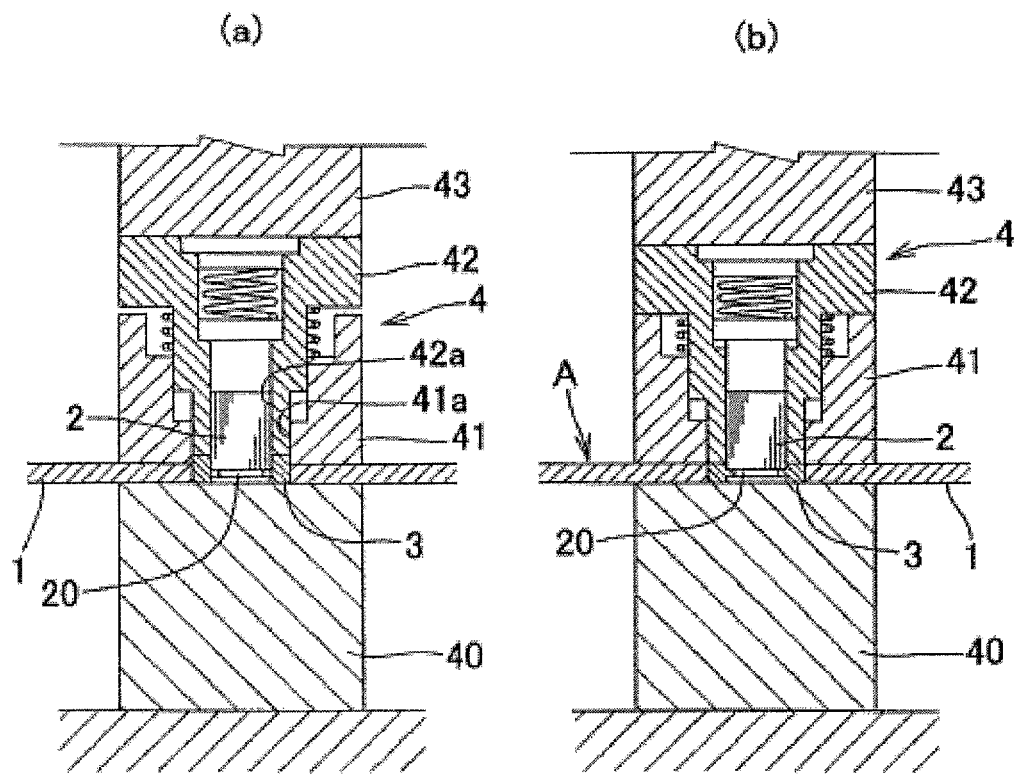
FIGS. 26(a) and 26(b) are explanatory diagrams illustrating another modification of the manufacturing method of the fourth embodiment.

In the embodiment shown in FIGS. 24(*a*) and 24(*b*), the plate-like body 1 is assembled to the midway part of the columnar body 2. However, as shown in FIGS. 25(*a*) and 25(*b*), the plate-like body 1 may also, of course, be assembled to the end part of the columnar body 2. Further, as shown in FIGS. 26(*a*) and 26(*b*), it is also a preferred modification that a circumferential groove 20 having a predetermined depth is formed at the assembly position on the outer circumferential surface of the columnar body 2, and, in the caulking step, the holding member 3 is compressively pressed from the axial direction of the columnar body 2 to thereby fix the holding member 3 to the outer circumferential surface of the columnar body 2 by pressure as well as cause the holding member 3 to bite into the circumferential groove 20 in the same manner as in the second embodiment.

Figure 27:
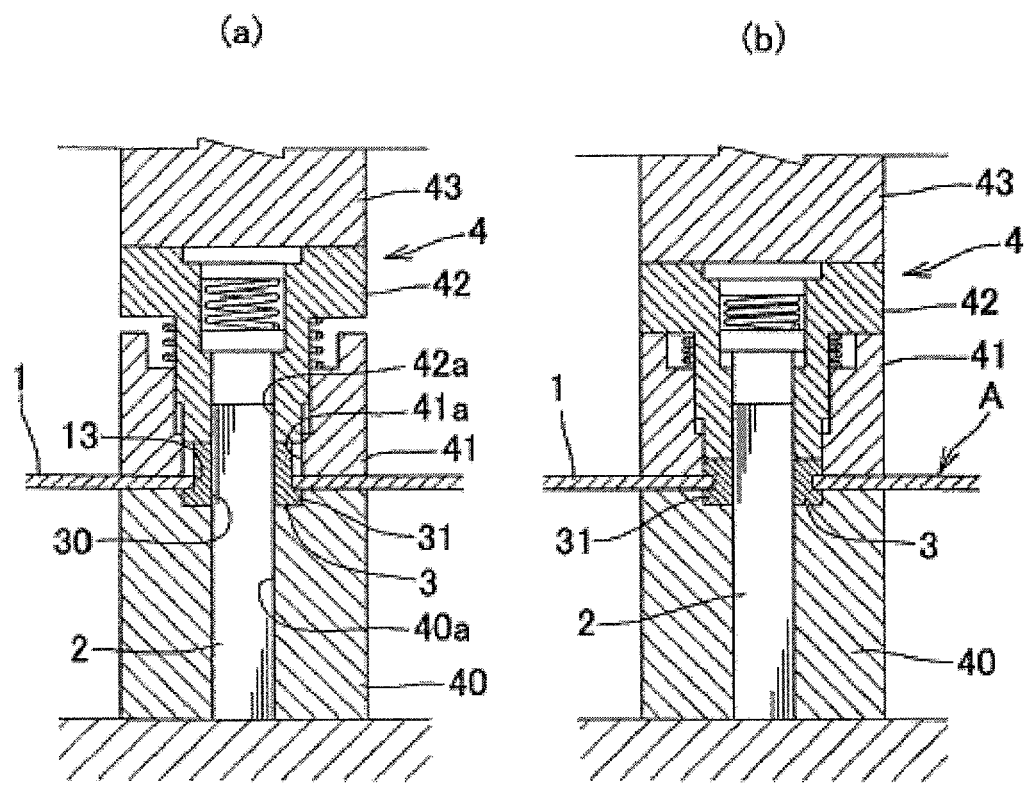
FIGS. 27(a) and 27(b) are explanatory diagrams illustrating yet another modification of the manufacturing method of the fourth embodiment.

The fixing of the holding member 3 to the inner circumferential part of the fitting hole 13 of the plate-like body 1 is preferably performed in such a manner that the holding member 3 is fixed to an inner circumferential surface of the fitting hole 13 by the spread thereof, and the holding member 3 is also plastically deformed so as to cover a part of one or both of an upper surface and a lower surface of the plate-like body 1 around the fitting hole 13 and is thereby fixed thereto. For example, FIGS. 27(*a*) and 27(*b*) illustrate a modification in which a flange portion 31 which is engaged with the lower surface of the plate-like body 1 around the fitting hole 13 is previously provided on an end of the holding member 3. Further, a space is set between an outer circumferential surface of the holding member 3 and the fitting hole 41*a* of the upper receiving tool 41. Accordingly, the plate-like body 1 is brought into a state where an area surrounding the fitting hole 13 protrudes into the set space and comes into contact with the outer circumferential surface of the holding member 3. By applying pressure to the holding member 3 in the axial direction of the columnar body 2, the holding member 3 is plastically deformed so as to cover a part of the upper surface of the plate-like body 1, the part surrounding the fitting hole 13, to thereby fix the holding member 3 to the plate-like body 1 so that the area surrounding the fitting hole 13 of the plate-like body 1 is surroundingly supported by the holding member 3 from both of the upper and lower surfaces thereof as shown in FIG. 27(*b*). As a result of this, the assembly strength is dramatically improved.

Figure 28:
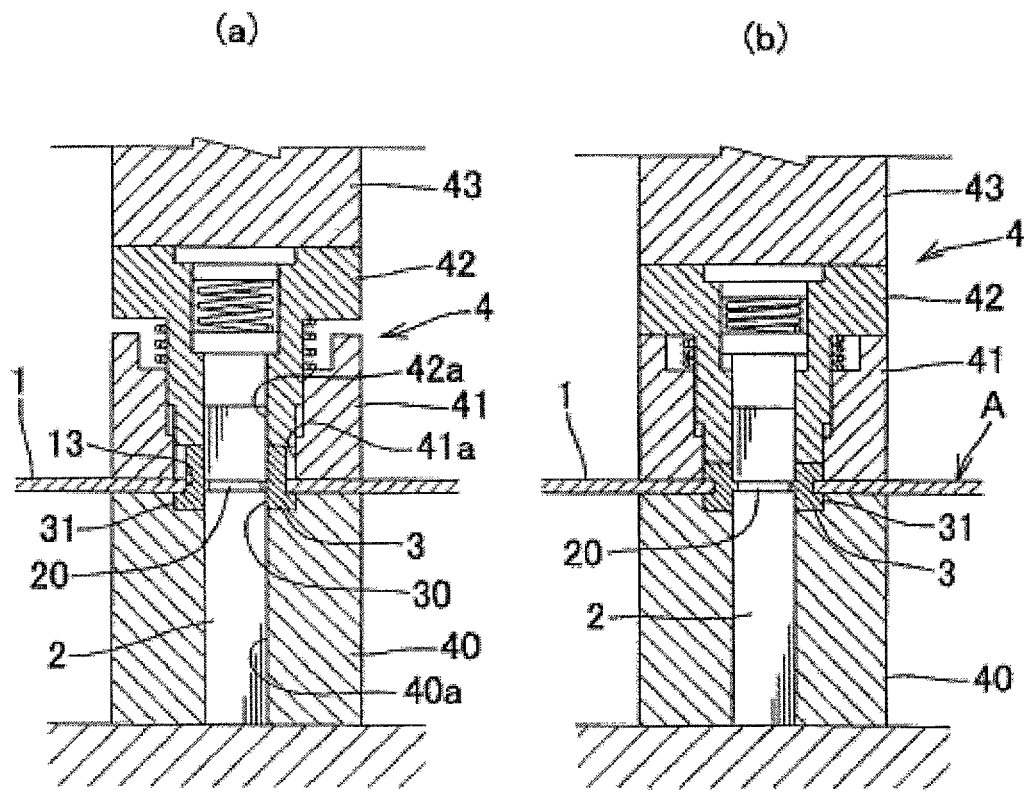
FIGS. 28(a) and 28(b) are explanatory diagrams illustrating yet another modification of the manufacturing method of the fourth embodiment.

FIGS. 28(*a*) and 28(*b*) illustrate a modification in which the circumferential groove 20 having a predetermined depth is further formed at the assembly position on the outer circumferential surface of the columnar body 2 in addition to the configuration of the modification shown in FIGS. 27(*a*) and 27(*b*), and the holding member 3 is caused to bite into the circumferential groove 20 in the caulking step. As a result of this, the assembly strength is further improved.

Figure 29:
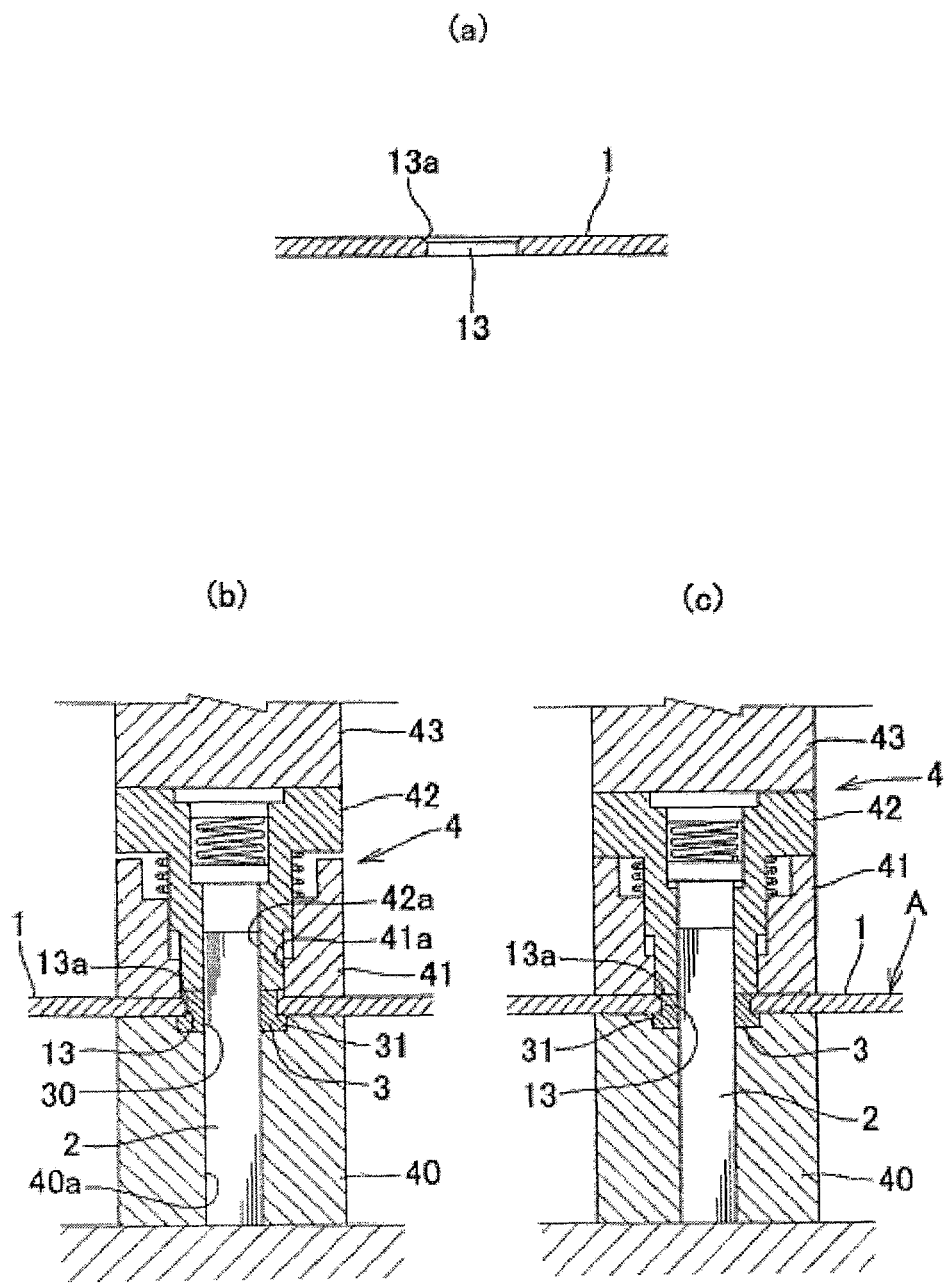
FIGS. 29(a) to 29(c) are explanatory diagrams illustrating yet another modification of the manufacturing method of the fourth embodiment.
Figure 30:
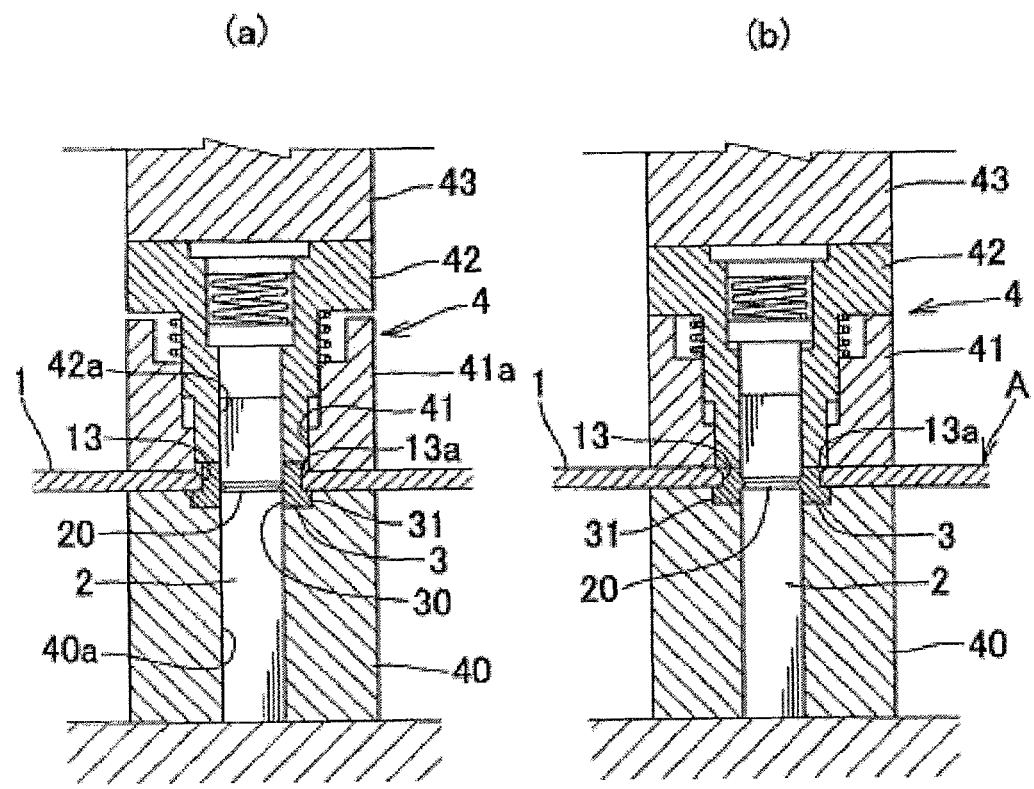
FIGS. 30(a) and 30(b) are explanatory diagrams illustrating yet another modification of the manufacturing method of the fourth embodiment.

FIGS. 29(*a*) to 29(*c*) illustrate a modification in which an inclined surface 13*a* is formed on an upper opening edge of the fitting hole 13 of the plate-like body 1 so that the upper opening edge is formed into a tapered shape whose diameter is reduced toward the inside of the fitting hole 13, and the holding member 3 is plastically deformed and thereby fixed to the inclined surface 13*a* by pressure. When a depression (the inclined surface 13*a* on the opening edge in this modification) is formed on the inner circumferential surface of the fitting hole 13 in this manner, a firm structure in which the area surrounding the fitting hole 13 of the plate-like body 1 is surroundingly supported by the holding member 3 is achieved as with the modification shown in FIGS. 27(a) and 27(b), and, at the same time, it is possible to provide a product having a flat upper surface as an assembly. FIGS. 30(a) and 30(b) illustrate a modification in which the circumferential groove 20 having a predetermined depth is further formed at the assembly position on the outer circumferential surface of the columnar body 2 in addition to the configuration of the modification shown in FIGS. 29(a) and 29(b), and the holding member 3 is caused to bite into the circumferential groove 20 in the caulking step. As a result of this, the assembly strength is further improved.

Figure 31:
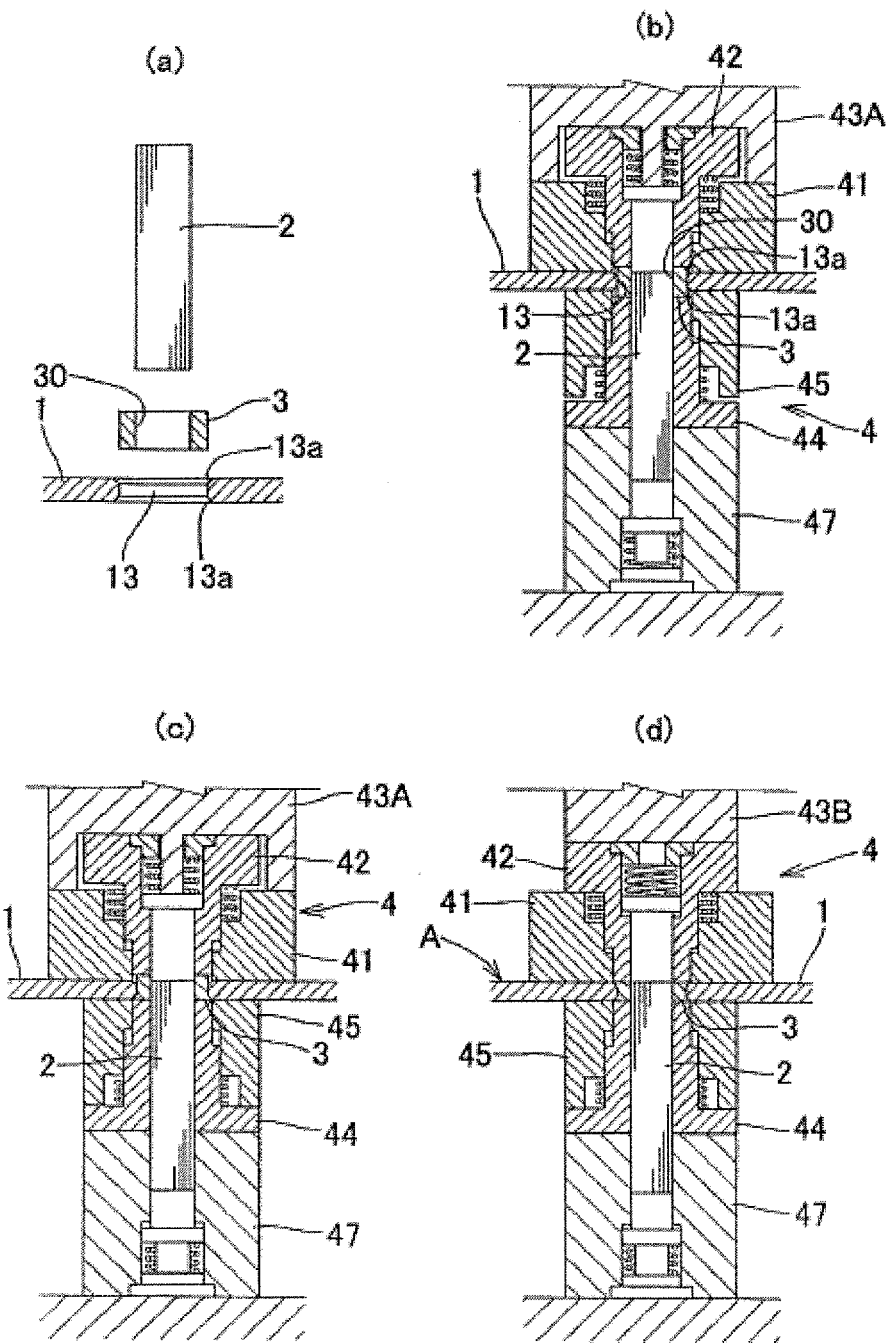
FIGS. 31(a) to 31(d) are explanatory diagrams illustrating yet another modification of the manufacturing method of the fourth embodiment.

Further, as shown in FIGS. 31(a) to 31(d), by forming depressions (upper and lower inclined surfaces 13a) on both of upper and lower opening edges of the fitting hole 13, it is possible to provide a product in which the area surrounding the fitting hole 13 is surroundingly supported by the holding member 3, and the holding member 3 and the plate-like body 1 are assembled so as to have flat upper and lower surfaces. In this case, the flange portion 31 of the holding member 3 is not required. In this modification, as shown in FIGS. 31(b) to 31(d), the assembly can be reliably performed by dividing a manufacturing process into two steps including a step of plastically deforming a lower end of the holding member 3 so as to be fixed to the lower inclined surface 13a of the fitting hole 13 by pressure, and a step of plastically deforming an upper end of the holding member 3 so as to be fixed to the upper inclined surface 13a of the fitting hole 13 by pressure. Although the manufacturing process is divided into the two steps in this modification as just described, the manufacturing process may also, of course, be performed by a single step. When performing the manufacturing process by a single step, there is no problem if the upper end and the lower end of the holding member 3 are uniformly crashed. However, if the upper end and the lower end of the holding member 3 are alternately crashed, the processing may be performed with a relative position between the plate-like body 1 and the columnar body 2 in the axial direction of the columnar body 2 varying, which may cause variation in the accuracy and the holding strength. Therefore, in order to reliably and accurately perform the assembly, it is preferred to separately process the upper end and the lower end of the holding member 3 by the two steps.

More specifically, a press apparatus 4 is composed of a first lower receiving tool 44 which supports the holding member 3 from the lower surface thereof, a second lower receiving tool 45 which is slidingly guided up and down along an outer circumferential surface of the first lower receiving tool 44 and supports the plate-like body 1 from the lower surface thereof with being biased by a spring, a press tool 42 which presses the holding member 3 downward from the upper surface thereof in the axial direction of the columnar body 2, an upper receiving tool 41 which is slidingly guided up and down along an outer circumferential surface of the press tool 42, and presses and supports the plate-like body 1 from the upper surface thereof with being biased downward by a spring, a first pressure applying tool 43A which integrally presses down the press tool 42, the upper receiving tool 41 and the columnar body 2 which is biased upward by a spring and therefore movable, and a second pressure applying tool 43B which can apply pressure only to the press tool 42.

First, as shown in FIGS. 31(b) and 31(c), the press tool 42, the upper receiving tool 41 and the columnar body 2 are integrally pressed downward by the first pressure applying tool 43A. Accordingly, the plate-like body 1 and the second lower receiving tool 45 also integrally move downward. The lower end of the holding member 3 is thereby plastically deformed by applied pressure between the plate-like body 1 and the first lower receiving tool 44 which does not move, and fixed to the lower inclined surface 13a by pressure. Preferably, a relative movement distance of the second lower receiving tool 45 with respect to the first lower receiving tool 44 is determined so that the lower surface of the holding member 3 is made generally flush with the lower surface of the plate-like body 1 in the above state. Then, the first pressure applying tool 43A is replaced with the second pressure applying tool 43B, and only the press tool 42 is pressed downward by the second pressure applying tool 43B. As a result, as shown in FIG. 31(d), the upper end of the holding member 3 is plastically deformed by the applied pressure, and thereby fixed to the upper inclined surface 13a by pressure and assembled thereto so that the upper surface of the holding member 3 and the upper surface of the plate-like body 1 are made flat.

Figure 32:
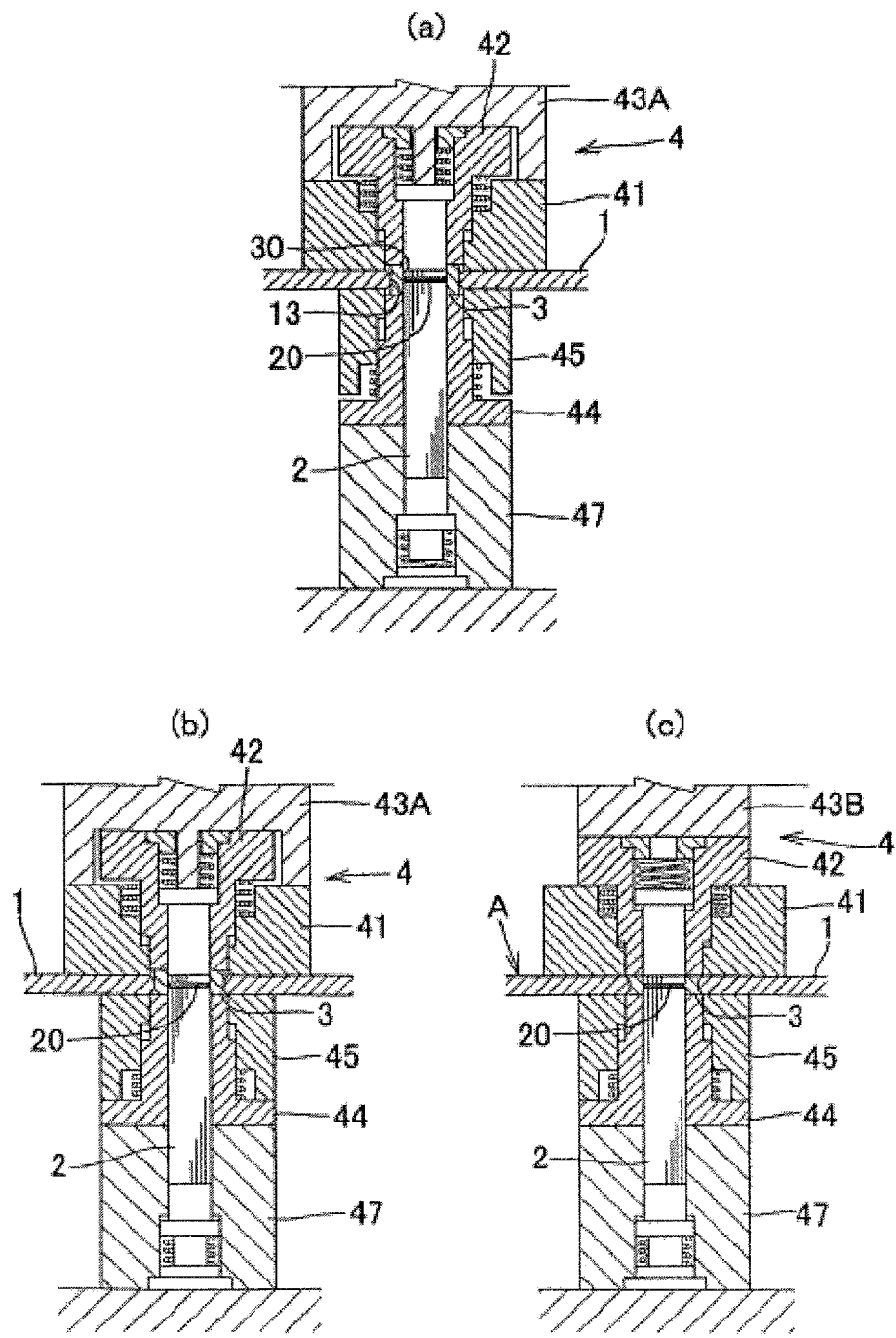
FIGS. 32(a) to 32(c) are explanatory diagrams illustrating yet another modification of the manufacturing method of the fourth embodiment.
Figure 33:
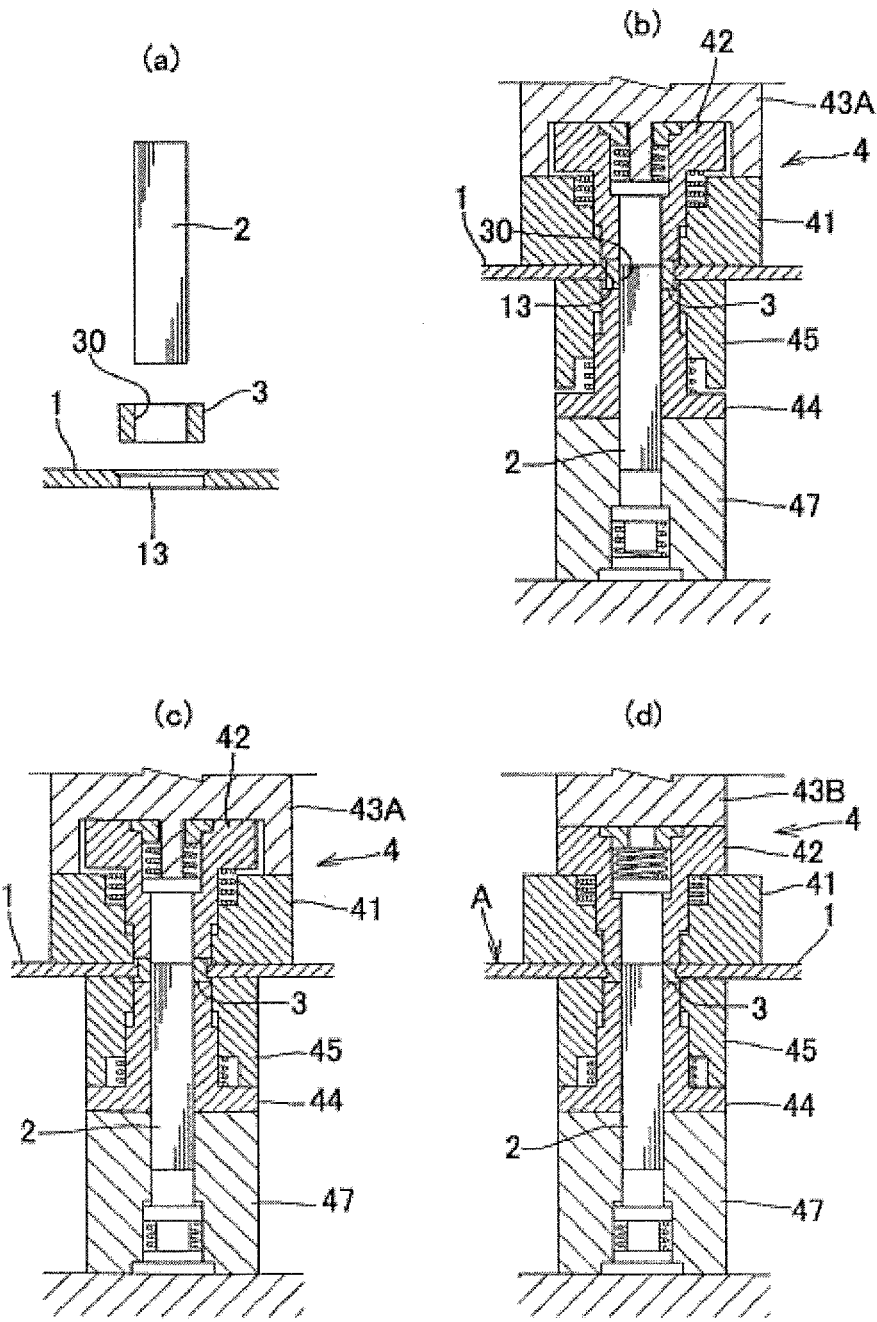
FIGS. 33(a) to 33(d) are explanatory diagrams illustrating yet another modification of the manufacturing method of the fourth embodiment.

FIGS. 32(a) to 32(c) illustrate a modification in which the circumferential groove 20 having a predetermined depth is further formed at the assembly position on the outer circumferential surface of the columnar body 2 in addition to the configuration of the modification shown in FIGS. 31(a) to 31(d), and the holding member 3 is caused to gradually bite into the circumferential groove 20 by two caulking steps. As a result of this, the assembly strength is further improved. Although depressions on the inner circumferential surface of the fitting hole 13 are composed of the inclined surfaces 13a on the opening edges in this modification, it is also a preferred modification that a similar circumferential groove is formed on the midway part, in the axial direction of the columnar body 2, of the inner circumferential surface of the fitting hole 13 as a depression, and the holding member 3 is caused to bite into the thus formed circumferential groove.

Figure 34:
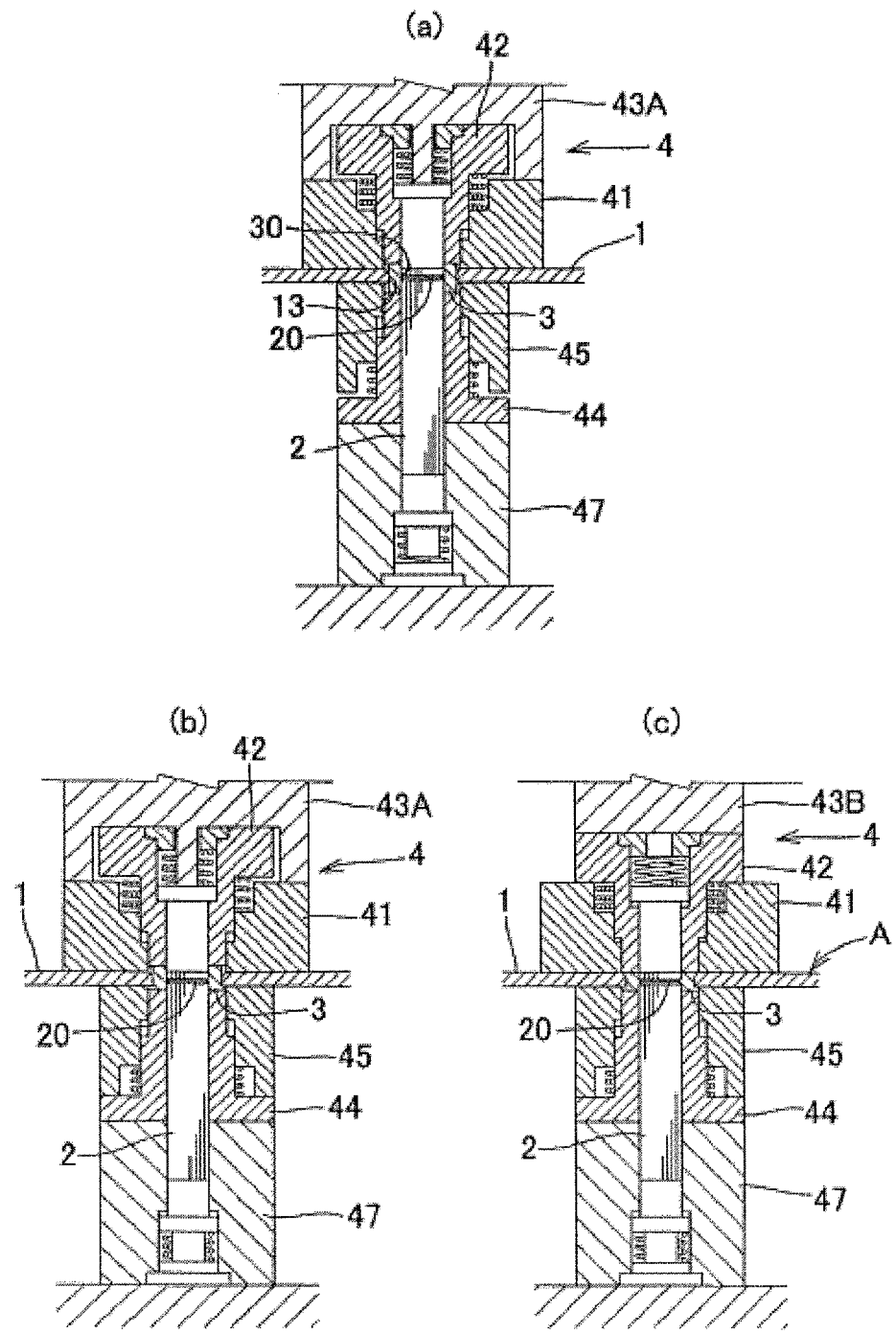
FIGS. 34(a) to 34(c) are explanatory diagrams illustrating yet another modification of the manufacturing method of the fourth embodiment.

Further, as shown in FIGS. 33(a) to 33(d), it is also a preferred modification that a depression (the inclined surface 13a) on the inner circumferential surface of the fitting hole 13 is formed only on one of the opening edges thereof (the upper opening edge), the one edge being positioned at a side in which the resulting surface is desired to be flat, the inclined surface 13a is not formed on the other opening edge thereof (the lower opening edge) and the flange portion 31 is also omitted, and pressure is applied to the lower end of the holding member 3, the lower end protruding further downward than the plate-like body 1, so that the lower end of the holding member 3 is plastically deformed so as to cover a part of the lower surface of the plate-like body 1 around the fitting hole 13, to thereby fix the holding member 3 to the plate-like body 1 so that an area surrounding the fitting hole 13 of the plate-like body 1 is surroundingly supported by the holding member 3 from both of the upper and lower surfaces thereof. In this case, the same press apparatus 4 as that in the modification shown in FIGS. 31(a) to 31(d) can be used. Also in this case, FIGS. 34(a) to 34(c) illustrate modification in which the circumferential groove 20 having a predetermined depth is further formed at the assembly position on the outer circumferential surface of the columnar body 2 in addition to the configuration of the modification shown in FIGS. 33(a) to 33(d), and the holding member 3 is caused to gradually bite into the circumferential groove 20 by the two caulking steps. As a result of this, the assembly strength is further improved.

Further, it is also a preferred modification that, in order to increase a contact area between the holding member 3 and the outer circumferential surface of the columnar body 2 in a state of being fixed to each other by caulking (in an assembled state), as shown in FIGS. 35(a) and 35(b), an inner circumferential edge of a pressure applying surface (a lower end surface) of the press tool 42 which applies pressure to the holding member 3, the inner circumferential edge facing the columnar body 2, is taperedly notched, and the holding member 3 is plastically deformed into a space s3 formed between the thus notched edge and the outer circumferential surface of the columnar body 2 to thereby increase the contact area. Although the holding member 3 has an annular shape in the present embodiment, the holding member 3 may also be formed into a part of an annular shape (a generally C-shape, for example), and these shapes can be appropriately selected depending on the intended use. Further, the shape of the holding member 3 can be appropriately selected depending on, for example, the shape of the columnar body 2 (a circular shape, a square shape, a plate-like shape and the like). For example, a modification in which the step portion 12 to be crushed shown in FIGS. 39 to 43(f) is replaced with the holding member 3 is also possible.

In the above, the embodiments of the present invention have been described. However, the present invention is not limited to these embodiments and may, of course, be embodied in various forms without departing from the scope of the invention. For example, although the circumferential groove 20 of each of the embodiments is a concave portion which is formed along the whole circumference of the columnar body 2, the circumferential groove 20 may also be formed in a part of the circumference of the columnar body 2 as long as it has a concave shape. That is, all concave shapes (thorough or non-through) may be employed as the shape of the circumferential groove 20 as long as it is capable of causing an object to bite thereinto. These forms can be appropriately selected depending on the intended use.

REFERENCE SIGNS LIST

A caulked assembly
1 plate-like body
1a depression
2 columnar body
3 holding member
4 press apparatus
5 lighting device
6 heat sink member
6a columnar body
6b plate-like base member
6d columnar body
6e thick portion
7 housing
10 mounting hole
10a inner circumferential part
11 thick portion
11a corner
11b outer circumferential surface
12 step portion
12a convex portion
12b receiving portion
13 fitting hole
13a inclined surface
14 hole
20 circumferential groove
30 mounting hole
31 flange portion
40 lower receiving tool
40a fitting hole
40c fitting convex portion
41 upper receiving tool
41a fitting hole
41c notched groove
42, 42A press tool
42a insertion hole
43, 43A, 43B pressure applying tool
44 first lower receiving tool
44a fitting hole
44b notched groove
45 second lower receiving tool
45a fitting hole
45c notched groove
46 press tool
46c fitting convex portion
47 base member
50 fan motor
51 first case
52 strut member
52a screw hole
52b screw hole
53 support plate
54 second case
56 power supply circuit unit
57 resin case
57A case main body
57B cover body
58 base
72 mounting screw
77 mounting screw
80 light source
81 lens body
82 light source support base
83 lens fixing member
84 through hole
103 bush
s1, s3 space

The invention claimed is:

1. A method for manufacturing a caulked assembly of a metallic plate body with a hollow or solid columnar body, the method comprising the steps of:
   providing, in the metallic plate body, a mounting hole for inserting and assembling the columnar body and forming a thick portion along an inner circumferential edge of the mounting hole;
   inserting the columnar body into the mounting hole of the metallic plate body to set the metallic plate body in an assembly position having no circumferential groove on an outer circumferential surface of the columnar body; and
   caulking for compressively pressing the thick portion from an axial direction of the columnar body to plastically deform the thick portion toward a center of the mounting hole to tighten and fix the thick portion to a position having no circumferential groove of the outer circumferential surface of the columnar body.

2. The method for manufacturing the caulked assembly according to claim 1, wherein the columnar body is formed into a straight shape which does not have a flange portion to be locked with an upper surface or a lower surface of a circumferential edge of the mounting hole of the metallic plate body in an end part and a midway part in an axial direction of the columnar body.

* * * * *